US008896005B2

(12) United States Patent
Van De Ven et al.

(10) Patent No.: US 8,896,005 B2
(45) Date of Patent: Nov. 25, 2014

(54) LIGHTING DEVICES THAT COMPRISE ONE OR MORE SOLID STATE LIGHT EMITTERS

(75) Inventors: Antony Paul Van De Ven, Hong Kong (CN); Gerald H. Negley, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/846,036

(22) Filed: Jul. 29, 2010

(65) Prior Publication Data

US 2012/0025235 A1 Feb. 2, 2012

(51) Int. Cl.

| | |
|---|---|
| ***H01L 33/00*** | (2010.01) |
| ***H01L 21/00*** | (2006.01) |
| ***H01L 33/52*** | (2010.01) |
| *F21K 99/00* | (2010.01) |
| *F21Y 101/02* | (2006.01) |

(52) U.S. Cl.

CPC . *H01L 33/52* (2013.01); *F21K 9/56* (2013.01); *F21K 9/135* (2013.01); *F21Y 2101/02* (2013.01)

USPC ........................... 257/98; 362/249.02; 438/29

(58) Field of Classification Search

CPC ......... H01L 33/40; H01L 33/52; F21K 9/135; F21V 9/16; F21Y 2101/02

USPC .............. 257/98, 99, 100, E33.055, E33.001; 438/22, 26, 29; 362/317, 227, 231, 362/249.02

See application file for complete search history.

(56) References Cited

U.S. PATENT DOCUMENTS 3,816,847 A 6/1974 Nagao
4,501,637 A 2/1985 Mitchell et al.
6,502,956 B1 * 1/2003 Wu .............................. 362/237
6,522,065 B1 * 2/2003 Srivastava et al. ............ 313/503
6,541,800 B2 * 4/2003 Barnett et al. .................. 257/98
7,196,354 B1 3/2007 Erchak et al.
7,549,786 B2 6/2009 Higley et al.
7,744,266 B2 6/2010 Higley et al.
7,748,877 B1 * 7/2010 Colby ........................... 362/378
2005/0218801 A1 10/2005 Hon et al.
2005/0239227 A1 * 10/2005 Aanegola et al. ............... 438/26
2005/0243550 A1 11/2005 Stekelenburg
2005/0280014 A1 12/2005 Park et al.
2006/0098440 A1 * 5/2006 Allen ............................ 362/294

(Continued)

FOREIGN PATENT DOCUMENTS

DE 20 2008 007 267 U1 9/2008
WO 2004/077580 A2 9/2004
WO 2005/027576 A2 3/2005

OTHER PUBLICATIONS

Peter J . Blau, "Friction Science and Technology", 2008, CRC Press 2008, pp. 17-41.*

(Continued)

*Primary Examiner* — Nikolay Yushin
(74) *Attorney, Agent, or Firm* — Burr & Brown, PLLC

(57) ABSTRACT

A lighting device, comprising a solid state light emitter and a removable encapsulant element. A lighting device element, comprising a solid state light emitter and an encapsulant holding element configured to releasably hold a removable encapsulant element. A lighting device component, comprising a removable encapsulant element. A method, comprising removing a first removable encapsulant element from a lighting device that comprises at least a first solid state light emitter and inserting a second removable encapsulant element into the lighting device. An encapsulant element comprising a substantially transparent first material and a luminescent material within the first material.

65 Claims, 8 Drawing Sheets

(56) References Cited

U.S. PATENT DOCUMENTS

| | | | | |
|---|---|---|---|---|
| 2007/0096131 | A1 | 5/2007 | Chandra | |
| 2008/0084701 | A1 * | 4/2008 | Van De Ven et al. | 362/373 |
| 2008/0106907 | A1 | 5/2008 | Trott et al. | |
| 2008/0283861 | A1 * | 11/2008 | Loh et al. | 257/98 |
| 2009/0213595 | A1 * | 8/2009 | Alexander et al. | 362/373 |
| 2010/0277673 | A1 * | 11/2010 | Hoelen et al. | 349/68 |
| 2011/0050098 | A1 * | 3/2011 | Lenk et al. | 315/32 |

OTHER PUBLICATIONS

U.S. Appl. No. 61/245,288, filed Sep. 25, 2009, Pickard.

* cited by examiner

LIGHTING DEVICES THAT COMPRISE ONE OR MORE SOLID STATE LIGHT EMITTERS

FIELD OF THE INVENTIVE SUBJECT MATTER

The present inventive subject matter is directed to a lighting device. In some aspects, the present inventive subject matter is directed to a lighting device that comprises at least one solid state light emitting device, e.g., at least one light emitting diode and/or at least one luminescent material.

BACKGROUND

There is an ongoing effort to develop systems that are more energy-efficient. A large proportion (some estimates are as high as twenty-five percent) of the electricity generated in the United States each year goes to lighting, a large portion of which is general illumination (e.g., downlights, flood lights, spotlights and other general residential or commercial illumination products). Accordingly, there is an ongoing need to provide lighting that is more energy-efficient.

Solid state light emitters (e.g., light emitting diodes) are receiving much attention due to their energy efficiency. It is well known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient than solid state light emitters, such as light emitting diodes.

In addition, as compared to the normal lifetimes of solid state light emitters, e.g., light emitting diodes, incandescent light bulbs have relatively short lifetimes, i.e., typically about 750-1000 hours. In comparison, light emitting diodes have typical lifetimes between 50,000 and 70,000 hours. Fluorescent bulbs generally have lifetimes (e.g., 10,000-20,000 hours) that are longer than those of incandescent lights, but they typically provide less favorable color reproduction. The typical lifetime of conventional fixtures is about 20 years, corresponding to a light-producing device usage of at least about 44,000 hours (based on usage of 6 hours per day for 20 years). Where the light-producing device lifetime of the light emitter is less than the lifetime of the fixture, the need for periodic change-outs is presented. The impact of the need to replace light emitters is particularly pronounced where access is difficult (e.g., vaulted ceilings, bridges, high buildings, highway tunnels) and/or where change-out costs are extremely high.

General illumination devices are typically rated in terms of their color reproduction. Color reproduction is typically measured using the Color Rendering Index (CRI Ra). CRI Ra is a modified average of the relative measurements of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator.

Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower). Sodium lights are used, e.g., to light highways—driver response time, however, significantly decreases with lower CRI Ra values (for any given brightness, legibility decreases with lower CRI Ra).

The color of visible light output by a light emitter, and/or the color of blended visible light output by a plurality of light emitters can be represented on either the 1931 CIE (Commission International de I'Eclairage) Chromaticity Diagram or the 1976 CIE Chromaticity Diagram. Persons of skill in the art are familiar with these diagrams, and these diagrams are readily available (e.g., by searching "CIE Chromaticity Diagram" on the internet).

The CIE Chromaticity Diagrams map out the human color perception in terms of two CIE parameters x and y (in the case of the 1931 diagram) or u' and v' (in the case of the 1976 diagram). Each point (i.e., each "color point") on the respective Diagrams corresponds to a particular color. For a technical description of CIE chromaticity diagrams, see, for example, "Encyclopedia of Physical Science and Technology", vol. 7, 230-231 (Robert A Meyers ed., 1987). The spectral colors are distributed around the boundary of the outlined space, which includes all of the hues perceived by the human eye. The boundary represents maximum saturation for the spectral colors.

The 1931 CIE Chromaticity Diagram can be used to define colors as weighted sums of different hues. The 1976 CIE Chromaticity Diagram is similar to the 1931 Diagram, except that similar distances on the 1976 Diagram represent similar perceived differences in color.

In the 1931 Diagram, deviation from a point on the Diagram (i.e., "color point") can be expressed either in terms of the x, y coordinates or, alternatively, in order to give an indication as to the extent of the perceived difference in color, in terms of MacAdam ellipses. For example, a locus of points defined as being ten MacAdam ellipses from a specified hue defined by a particular set of coordinates on the 1931 Diagram consists of hues that would each be perceived as differing from the specified hue to a common extent (and likewise for loci of points defined as being spaced from a particular hue by other quantities of MacAdam ellipses).

Since similar distances on the 1976 Diagram represent similar perceived differences in color, deviation from a point on the 1976 Diagram can be expressed in terms of the coordinates, u' and v', e.g., distance from the point=$(\Delta u'^2+\Delta v'^2)^{1/2}$. This formula gives a value, in the scale of the u' v' coordinates, corresponding to the distance between points. The hues defined by a locus of points that are each a common distance from a specified color point consist of hues that would each be perceived as differing from the specified hue to a common extent.

A series of points that is commonly represented on the CIE Diagrams is referred to as the blackbody locus. The chromaticity coordinates (i.e., color points) that lie along the blackbody locus obey Planck's equation: $E(\lambda)=A\ \lambda^{-5}/(e^{(B/T)}-1)$, where E is the emission intensity, $\lambda$ is the emission wavelength, T is the color temperature of the blackbody and A and B are constants. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally blueish. This occurs because the wavelength associated with the peak radiation of the blackbody radiator becomes progressively shorter with increased temperature, consistent with the Wien Displacement Law. Illuminants that produce light that is on or near the blackbody locus can thus be described in terms of their color temperature.

The most common type of general illumination is white light (or near white light), i.e., light that is close to the blackbody locus, e.g., within about 10 MacAdam ellipses of the blackbody locus on a 1931 CIE Chromaticity Diagram. Light with such proximity to the blackbody locus is referred to as "white" light in terms of its illumination, even though some light that is within 10 MacAdam ellipses of the blackbody locus is tinted to some degree, e.g., light from incandescent bulbs is called "white" even though it sometimes has a golden or reddish tint; also, if the light having a correlated color temperature of 1500 K or less is excluded, the very red light along the blackbody locus is excluded.

The emission spectrum of any particular light emitting diode is typically concentrated around a single wavelength (as dictated by the light emitting diode's composition and structure), which is desirable for some applications, but not desirable for others, (e.g., for providing general illumination, such an emission spectrum provides a very low CRI Ra).

Because light that is perceived as white is necessarily a blend of light of two or more colors (or wavelengths), no single light emitting diode junction has been developed that can produce white light.

"White" solid state light emitting lamps have been produced by providing devices that mix different colors of light, e.g., by using light emitting diodes that emit light of differing respective colors and/or by converting some or all of the light emitted from the light emitting diodes using luminescent material. For example, as is well known, some lamps (referred to as "RGB lamps") use red, green and blue light emitting diodes, and other lamps use (1) one or more light emitting diodes that generate blue light and (2) luminescent material (e.g., one or more phosphor materials) that emits yellow light in response to excitation by light emitted by the light emitting diode, whereby the blue light and the yellow light, when mixed, produce light that is perceived as white light. While there is a need for more efficient white lighting, there is in general a need for more efficient lighting in all hues.

There are a number of challenges presented with using solid state light emitters in lighting devices. In many cases, additional components are added to the lighting devices in order to address these challenges. It would be desirable to provide a lighting device that comprises one or more solid state light emitters, in which such challenges are addressed and yet the lighting device can fit within the same or substantially the same space that is provided for comparable conventional lighting devices (e.g., the space occupied by conventional incandescent light sources and/or fluorescent light sources). The ability for a lighting device that includes one or more solid state light emitters to fit in a space that is similar to (or identical to) a space that would be occupied by conventional devices is important when retrofitting a lighting device, as well when installing a lighting device in new construction.

One such challenge results from the fact that the emission spectrum of any particular light emitting diode is typically concentrated around a single wavelength (as dictated by the light emitting diode's composition and structure), which is desirable for some applications, but not desirable for others, (e.g., for providing general illumination, such an emission spectrum generally does not provide light that appears white, and/or provides a very low CRI). As a result, in many cases (e.g., to make devices that emit light perceived as white or near-white, or to make devices that emit light that is not highly saturated) it is necessary to employ light sources (e.g., one or more solid state light emitters and optionally also one or more other types of light sources, e.g., additional light emitting diodes, luminescent materials, incandescent lights, etc.) that emit light of different colors. There are a variety of reasons that one or more solid state light emitters might cease emitting light and/or vary in their intensity of light emission, which can throw off the balance of color output and cause the lighting device to emit light that is perceived as being of a color that differs from the desired color of light output. As a result, in many of such devices, one challenge that necessitates the inclusion of additional components is that there may be a desire to provide additional circuitry that can adjust the current supplied to respective solid state light emitters (and/or other light emitters) in order to maintain the balance of color output among the light emitters that emit light of different colors in order to achieve the desired color output.

Another such challenge is that there may be a desire to mix the light of different colors emitted from the different solid state light emitters by providing additional structure to assist in such mixing.

Another example of a reason that one or more solid state light emitters might vary in their intensity of light emission is damage to the solid state light emitter(s) and/or damage to circuitry that supplies current to the solid state light emitter(s).

Another challenge presented in making a lighting device with light emitting diodes, that often necessitates the inclusion of additional components, is that the performance of many solid state light emitters may be reduced when they are subjected to elevated temperatures. For example, many light emitting diode light sources have average operating lifetimes of decades as opposed to just months or 1-2 years for many incandescent bulbs, but some light emitting diodes' lifetimes can be significantly shortened if they are operated at elevated temperatures. A common manufacturer recommendation is that the junction temperature of a light emitting diode should not exceed 85 degrees C. if a long lifetime is desired. There may be a desire to counteract such problems, in many instances, by providing additional structure (or structures) to provide a desired degree of heat dissipation.

Another challenge presented in making a lighting device with light emitting diodes, that often necessitates the inclusion of additional components, arises from the relatively high light output from a relatively small area provided by solid state emitters. Such a concentration of light output may present challenges in providing solid state lighting systems for general illumination in that, in general, a large difference in brightness in a small area may be perceived as glare and may be distracting to occupants. In many instances, therefore, there is a desire to provide additional structure to assist in mixing the emitted light and/or creating the perception that the emitted light is output through a larger area.

Another challenge presented in making a lighting device with light emitting diodes, that often necessitates the inclusion of additional components, is that light emitting diodes are typically operated most effectively on low voltage DC current, while line voltage is typically much higher voltage AC current. As a result, there is often a desire to provide circuitry that converts line voltage, e.g., from AC to DC and/or that reduces voltage.

In addition, in some circumstances, there is a desire either to retrofit or install a lighting device in a circuit that has a conventional dimmer. Some dimmers operate based on signals contained in the current supplied to the lighting device (for example, duty cycle of an AC signal, e.g., from a triac), for which additional circuitry is generally needed.

It would be desirable to be able to make a variety of lighting devices that include different numbers of solid state light emitters (and which thereby generate heat at a variety of different rates), and to be able to address the effects caused by such different rates of heat generation (including elevated rates of heat generation), and/or to be able to make such lighting devices in a wide variety of shapes and sizes, including those that correspond to conventional lighting devices.

There exist conventional lighting devices that have light intensity outputs and/or power inputs that would require a wide variety of circuitry in order to provide equivalent output from a lighting device comprising one or more solid state light emitters, and it would be desirable to be able to easily make a variety of solid state light emitter lighting devices that can provide such light intensity outputs and/or that can be powered by such power inputs.

A quality of solid state lighting that has hindered its use is its equipment cost. In many cases, the equipment cost for solid state lighting is roughly one-third power conversion, one-third light emitting diodes and one-third mechanical parts.

Although the development of solid state light emitters (e.g., light emitting diodes) has in many ways revolutionized the lighting industry, some of the characteristics of solid state light emitters have presented challenges, some of which have not yet been fully met.

There is an ongoing need for improvements in light sources that provide higher efficiency, reduced operating cost, and/or reduced initial cost.

BRIEF SUMMARY

As noted above, one very attractive quality of solid state lighting is its efficiency and hence its low operating cost. One way to make solid state lighting more attractive would be to extend the already superior useful life of at least some of the components of lighting devices that employ solid state lighting, whereby the equipment cost over time could be even further reduced in comparison with other lighting options.

Solid state lighting devices typically degrade over time (although such degradation generally takes much longer to occur than in the cases of other lighting options, such as incandescent lights and fluorescent lights). Such degradation is typically more rapid when the solid state light emitter(s) in the solid state lighting device is/are subjected to higher temperatures. In the case of solid state lighting devices, degradation is often caused by degradation of material (e.g., silicone material(s) and/or epoxy material) used to encapsulate the solid state light emitter(s). Such encapsulant material is often used to encapsulate (e.g., hold and protect) one or more light emitting diode and/or to hold one or more luminescent material (e.g., the luminescent material is dispersed within the encapsulant material).

Another challenge with solid state lighting devices is color shift. Energy star has limits that the color of light emission from a solid state lighting device should change over time. The current limit is set at delta u'v' of not greater than 0.007 for 6000 hours of operation, and a proposed maximum for fixtures is not greater than 0.001 or 0.002, depending on whether the fixture is commercial grade or residential grade. One of the reasons that light emitted by solid state light emitting devices (e.g., that comprise one or more LEDs and one or more luminescent materials) changes in color over time is that the encapsulant (e.g., silicone or epoxy) sometimes degrades slightly with exposure to heat and exposure to blue light over time.

In accordance with one aspect of the present inventive subject matter, there is provided a lighting device that comprises at least one solid state light emitter and at least one removable encapsulant element (which may or may not include one or more luminescent material therein, e.g., dispersed therein). With such a device, it is possible to periodically replace the encapsulant element (or encapsulant elements), according to a predetermined schedule or whenever deemed necessary. In such a way, the lifetime of the solid state light emitter can be extended, and/or the lighting device can be operated at higher temperature (i.e., to generate more light) than would otherwise be possible.

For example, in satisfying a given lighting requirement (e.g., overall brightness in a particular room, e.g., a dining area in a restaurant), equipment cost can be reduced by using fewer lighting devices (each lighting device comprising at least one removable encapsulant element and at least one solid state light emitter) and supplying higher current to the at least one solid state light emitter to make up for the fewer number of lighting devices. In such a case, it is recognized that the higher operating temperatures generated by operating the at least one solid state light emitter at higher current may cause the lighting device(s) to degrade more rapidly (due primarily to degradation of the encapsulant), but that the effects of such degradation can be addressed by replacing the encapsulant element(s) (or one or more of a plurality of encapsulant elements) at the onset of degradation (or at any other stage of degradation).

Alternatively or additionally, equipment cost can be reduced (or further reduced) by eliminating one or more heat sink elements that would otherwise be provided in order for the operating temperature of the at least one solid state light emitter to be held to a level at which degradation of the at least one solid state light emitter is deemed to be acceptable, recognizing that the effects of more rapid degradation of the at least one solid state light emitter resulting from such higher operating temperatures can be addressed by replacing the encapsulant element(s) (or one or more of a plurality of encapsulant elements) at the onset of degradation (or at any other stage of degradation).

By providing a lighting device in which an encapsulant is removable and/or can be replaced, color shift problems can be addressed, especially if the current used to drive the light emitter(s) exceeds 200 mA per square mm of chip area, the heat generated is not dissipated effectively, and/or the cost of materials are selected to minimize equipment cost.

In one aspect of the present inventive subject matter, there is provided a lighting device that comprises at least a first solid state light emitter (e.g., a light emitting diode) and at least a first removable encapsulant element.

In some embodiments, which can include or not include, as suitable, any of the other features described herein, the first removable encapsulant element can comprise at least one luminescent material.

In some embodiments, which can include or not include, as suitable, any of the other features described herein, the lighting device can further comprise at least one encapsulant holding element that retains the first removable encapsulant element where at least some light emitted by the first solid state light emitter enters the first removable encapsulant element. In some of such embodiments, the at least one encapsulant holding element can comprise at least a first holding element structure and a second holding element structure, with the first removable encapsulant element between the first holding element structure and the second holding element structure. In some embodiments where first and second holding element structures are included, at least a portion of the first holding element structure can be substantially transparent, the first solid state light emitter can be mounted on the second holding element structure, the second holding element structure can comprise at least one electrically conductive region, and/or the first holding element structure can be releasably held in place relative to the second holding element structure.

In some embodiments, which can include or not include, as suitable, any of the other features described herein, the lighting device can comprise at least one encapsulant holding element that substantially surrounds the first removable encapsulant element.

In some embodiments, which can include or not include, as suitable, any of the other features described herein, the lighting device can comprise at least one encapsulant holding element that defines a space, and the at least a first solid state light emitter and the at least a first removable encapsulant element substantially fill the space.

In another aspect of the present inventive subject matter, there is provided a lighting device element that comprises at least a first solid state light emitter and at least one encapsulant holding element configured to releasably secure a removable encapsulant element where at least some light emitted by the first solid state light emitter would enter the first removable encapsulant element.

In some of such embodiments, the at least one encapsulant holding element comprises a first holding element structure and a second holding element structure. In some of these embodiments, (1) at least a portion of the first holding element structure can be substantially transparent, and/or (2) the first solid state light emitter can be mounted on the second holding element structure, and/or (3) the second holding element structure can comprise at least one electrically conductive region, and/or (4) the first holding element structure can be releasably held in place relative to the second holding element structure.

In another aspect of the present inventive subject matter, there is provided a lighting device component that comprises a removable encapsulant element. In some of such embodiments, the encapsulant element can comprise at least one luminescent material.

In another aspect of the present inventive subject matter, there is provided a method that comprises:

removing at least a first removable encapsulant element from a lighting device that comprises at least a first solid state light emitter (e.g., a light emitting diode); and inserting at least a second removable encapsulant element into the lighting device.

In some embodiments according to this aspect of the present inventive subject matter, which can include or not include, as suitable, any of the other features described herein, the lighting device further comprises at least a first encapsulant holding element that retains the first removable encapsulant element, and the method further comprises opening the first encapsulant holding element prior to removing the first removable encapsulant element and closing the first encapsulant holding element after inserting the second removable encapsulant element. In some of such embodiments:

the first encapsulant holding element comprises a first holding element structure and a second holding element structure, the first encapsulant holding element has a closed position, in which the first removable encapsulant element can be between the first holding element structure and the second holding element structure, the first encapsulant holding element has an open position, said opening the first encapsulant holding element comprises moving the first holding element structure relative to the second holding element structure to change the first encapsulant holding element from the closed position to the open position, and said closing the first encapsulant holding element comprises moving the first holding element structure relative to the second holding element structure to change the first encapsulant holding element from the open position to the closed position.

In some embodiments according to this aspect of the present inventive subject matter, which can include or not include, as suitable, any of the other features described herein, at least a portion of the first holding element structure can be substantially transparent, and/or the first solid state light emitter can be mounted on the second holding element structure.

Also, the present inventive subject matter provides technological features that can be considered to be "green" in the sense that one or more components from a lighting device that is deemed to be unsuitable for further use can be "recycled" by replacing at least one removable encapsulant element in the lighting device and returning the lighting device to active use.

In another aspect of the present inventive subject matter, there is provided an encapsulant element that comprises a substantially transparent first material and at least one luminescent material within the first material.

The inventive subject matter may be more fully understood with reference to the accompanying drawings and the following detailed description of the inventive subject matter.

BRIEF DESCRIPTION OF THE DRAWING FIGURES

Figure 3:
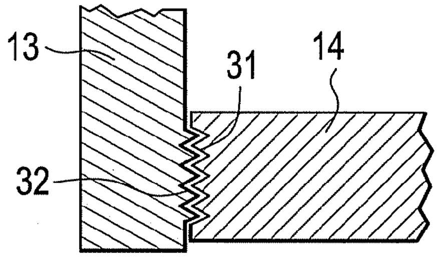

FIG. 3 is a partial cross-sectional view depicting a portion of a first holding element structure 13 that is held in place relative to a second holding element structure 14 by threads 31.

Figure 4:
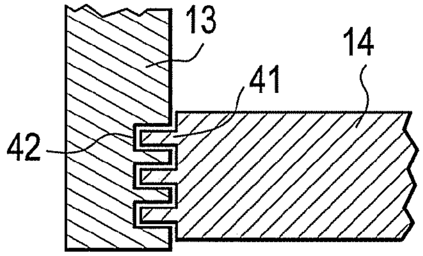

FIG. 4 is a partial cross-sectional view depicting a portion of a first holding element structure 13 that is held in place relative to a second holding element structure 14 by pins 41.

Figure 5:
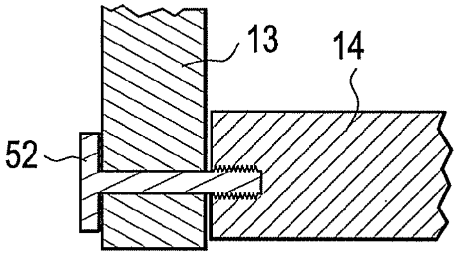

FIG. 5 is a partial cross-sectional view depicting a portion of a first holding element structure 13 that is held in place relative to a second holding element structure 14 using screws 52.

Figure 6:
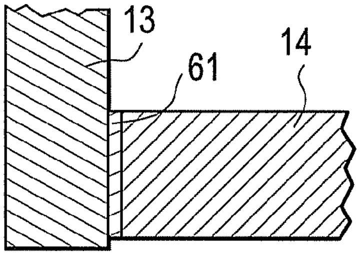

FIG. 6 is a partial cross-sectional view depicting a portion of a first holding element structure 13 that is held in place relative to a second holding element structure 14 using adhesive 61.

Figure 7:
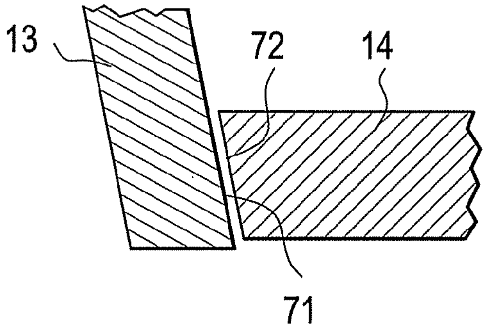

FIG. 7 is a partial cross-sectional view depicting a portion of a first holding element structure 13 that is held in place relative to a second holding element structure 14 through geometry.

Figure 8:
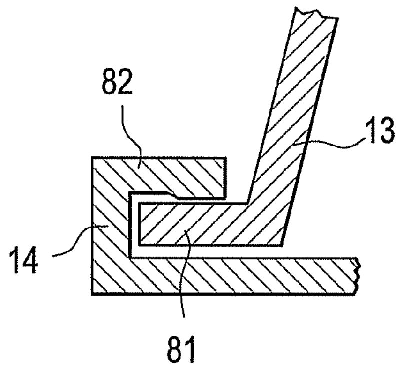

FIG. 8 is a partial cross-sectional view depicting a portion of a first holding element structure 13 that is held in place relative to a second holding element structure 14 by sliding engagement.

Figure 9:
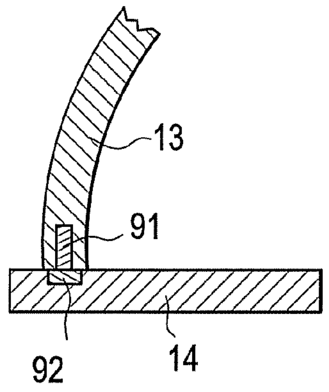

FIG. 9 is a partial cross-sectional view depicting a portion of a first holding element structure 13 that is held in place relative to a second holding element structure 14 by a magnet 91.

Figure 10:
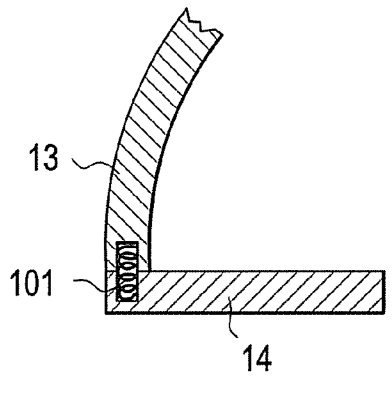

FIG. 10 is a partial cross-sectional view depicting a portion of a first holding element structure 13 that is held in place relative to a second holding element structure 14 by a spring 101.

Figure 11:
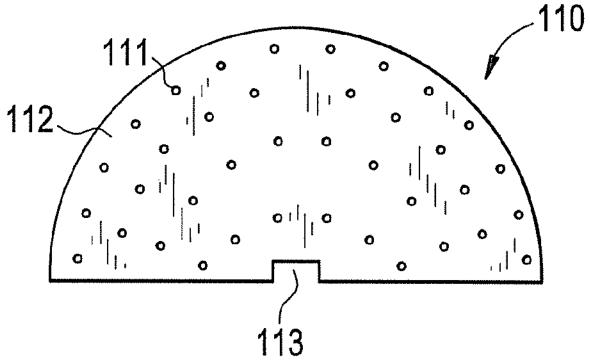

FIG. 11 is a cross-sectional view of an encapsulant element 110.

Figure 1:
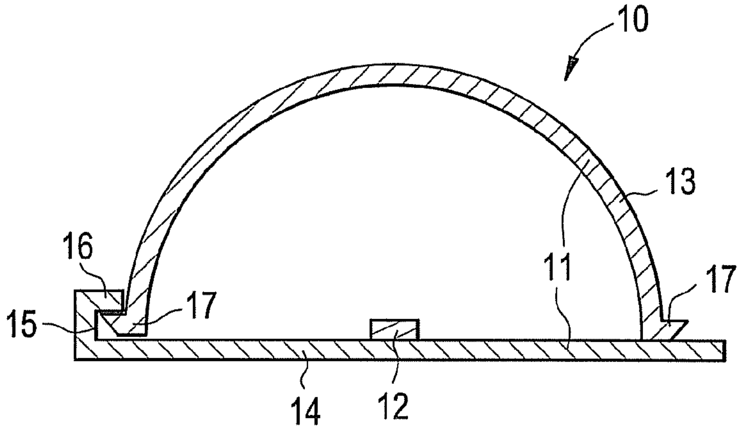
FIG. 1 is a cross-sectional view of a lighting device element 10.
Figure 12:
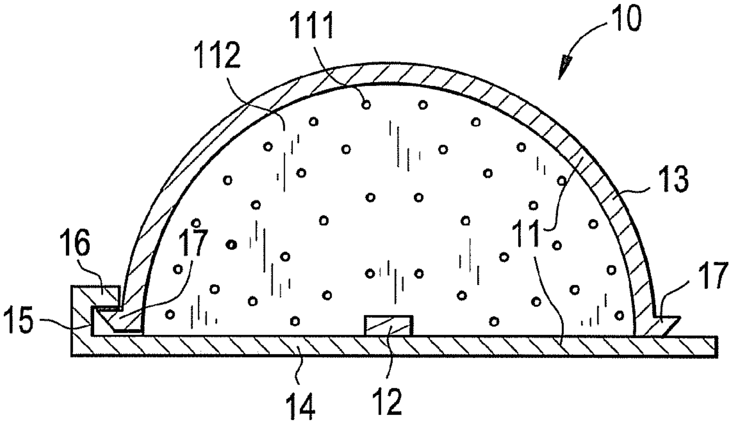

FIG. 12 is a cross-sectional view of a lighting device that comprises a a lighting device element 10 as depicted in FIG. 1 and an encapsulant element 110 as depicted in FIG. 11.

Figure 13:
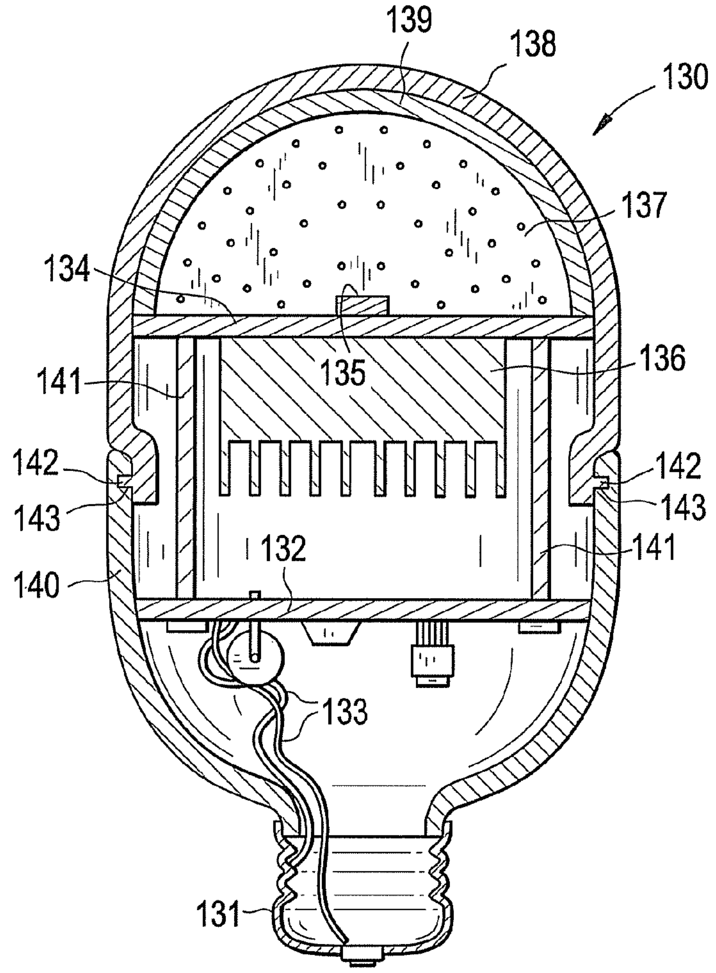

FIG. 13 is a cross-sectional view of a lighting device 130.

Figure 14:
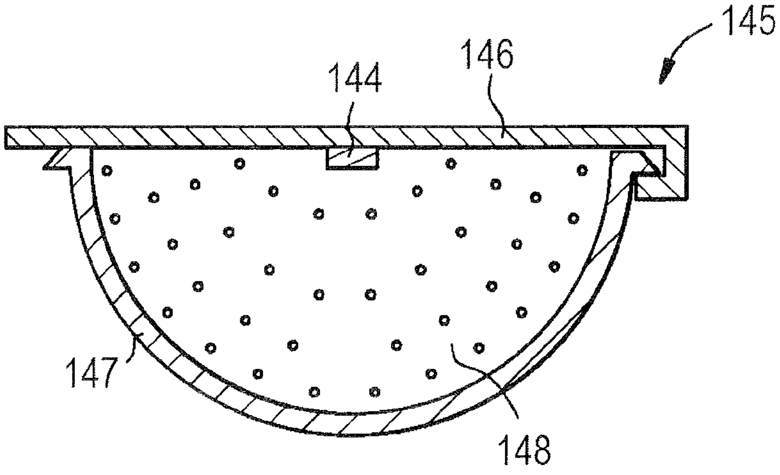

FIG. 14 is a cross-sectional view of a lighting device 140 in the form of a back-reflector device.

Figure 15:
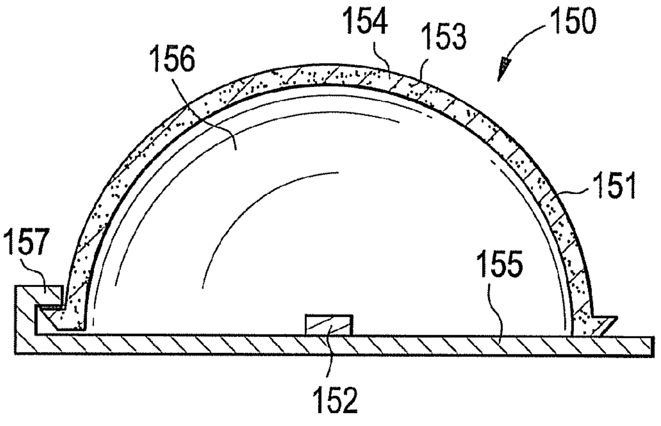

FIG. 15 is a cross-sectional view of a lighting device element 150.

DETAILED DESCRIPTION

The present inventive subject matter now will be described more fully hereinafter with reference to the accompanying drawings, in which embodiments of the inventive subject matter are shown. However, this inventive subject matter should not be construed as being limited to the embodiments set forth herein. Rather, these embodiments are provided so that this disclosure will be thorough and complete, and will fully convey the scope of the inventive subject matter to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

When an element such as a layer, region or substrate is referred to herein as being "on", being mounted "on", being mounted "to", or extending "onto" another element, it can be in or on the other element, and/or it can be directly on the other element, and/or it can extend directly onto the other element, and it can be in direct contact or indirect contact with the other element (e.g., intervening elements may also be present). In contrast, when an element is referred to herein as being "directly on" or extending "directly onto" another element, there are no intervening elements present. Also, when an element is referred to herein as being "connected" or "coupled" to another element, it can be directly connected or coupled to the other element or intervening elements may be present. In contrast, when an element is referred to herein as being "directly connected" or "directly coupled" to another element, there are no intervening elements present. In addition, a statement that a first element is "on" a second element is synonymous with a statement that the second element is "on" the first element.

The expression "in contact with", as used herein, means that the first structure that is in contact with a second structure is in direct contact with the second structure or is in indirect contact with the second structure. The expression "in indirect contact with" means that the first structure is not in direct contact with the second structure, but that there are a plurality of structures (including the first and second structures), and each of the plurality of structures is in direct contact with at least one other of the plurality of structures (e.g., the first and second structures are in a stack and are separated by one or more intervening layers). The expression "direct contact", as used in the present specification, means that the first structure which is "in direct contact" with a second structure is touching the second structure and there are no intervening structures between the first and second structures at least at some location.

A statement herein that two components in a device are "electrically connected," means that there are no components electrically between the components that affect the function or functions provided by the device. For example, two components can be referred to as being electrically connected, even though they may have a small resistor between them which does not materially affect the function or functions provided by the device (indeed, a wire connecting two components can be thought of as a small resistor); likewise, two components can be referred to as being electrically connected, even though they may have an additional electrical component between them which allows the device to perform an additional function, while not materially affecting the function or functions provided by a device which is identical except for not including the additional component; similarly, two components which are directly connected to each other, or which are directly connected to opposite ends of a wire or a trace on a circuit board, are electrically connected. A statement herein that two components in a device are "electrically connected" is distinguishable from a statement that the two components are "directly electrically connected", which means that there are no components electrically between the two components.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Relative terms, such as "lower", "bottom", "below", "upper", "top" or "above," may be used herein to describe one element's relationship to another elements as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The term "illumination" (or "illuminated"), as used herein means that a light source is emitting electromagnetic radiation. For example, when referring to a solid state light emitter, the term "illumination" means that at least some current is being supplied to the solid state light emitter to cause the solid state light emitter to emit at least some electromagnetic radiation (in some cases, with at least a portion of the emitted radiation having a wavelength between 100 nm and 1000 nm, and in some cases within the visible spectrum). The expression "illuminated" also encompasses situations where the light source emits light continuously or intermittently at a rate such that if it is or was visible light, a human eye would perceive it as emitting light continuously (or discontinuously), or where a plurality of light sources (especially in the case of solid state light emitters) that emit light of the same color or different colors are emitting light intermittently and/or alternatingly (with or without overlap in "on" times) in such a way that if they were or are visible light, a human eye would perceive them as emitting light continuously or discontinuously (and, in cases where different colors are emitted, as a mixture of those colors).

The expression "excited", as used herein when referring to luminescent material, means that at least some electromagnetic radiation (e.g., visible light, UV light or infrared light) is contacting the luminescent material, causing the luminescent material to emit at least some light. The expression "excited" encompasses situations where the luminescent material emits light continuously, or intermittently at a rate such that a human eye would perceive it as emitting light continuously or intermittently, or where a plurality of luminescent materials that emit light of the same color or different colors are emitting light intermittently and/or alternatingly (with or without overlap in "on" times) in such a way that a human eye would perceive them as emitting light continuously or intermittently (and, in some cases where different colors are emitted, as a mixture of those colors).

The expression "adjacent", as used herein to refer to a spatial relationship between a first structure and a second structure, means that the first and second structures are next to each other. That is, where the structures that are described as being "adjacent" to one another are similar, no other similar structure is between the first structure and the second structure (for example, where two dissipation elements are adjacent to each other, no other dissipation element is between them). Where the structures that are described as being "adjacent" to one another are not similar, no other structure is between them.

The expression "lighting device", as used herein, is not limited, except that it indicates that the device is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

The expression "substantially transparent", as used herein, means that the structure which is characterized as being substantially transparent allows passage of at least 80% of incident visible light. The expression "partially transparent", as used herein, means that the structure which is characterized as being partially transparent allows passage of some incident visible light, but less than 80% of incident visible light. The expression "transparent", as used herein, means that the structure which is characterized as being transparent allows passage of substantially all incident visible light (e.g., at least 98%).

The expression "substantially translucent", as used herein, means that at least 95% of the structure which is characterized as being substantially translucent allows passage of at least some light. The expression "partially translucent", as used herein, means that at least a portion (but less than 95%) of the structure which is characterized as being partially translucent allows passage of at least some light.

The term "removable", as used herein, means that the element (e.g., one or more encapsulant elements) that is characterized as being removable can be removed from the lighting device without structurally changing any component in the remainder of the lighting device, e.g., an encapsulant element (or two or more encapsulant elements) can be removed from the lighting device and replaced with a replacement encapsulant element (or two or more replacement encapsulant elements) so that the lighting device with the replacement encapsulant element(s) is structurally substantially identical to the lighting device with the previous encapsulant element(s) except for the encapsulant element(s) (or, if the replacement encapsulant element(s) is substantially identical to the previous encapsulant element(s), the entirety of the lighting device with the replacement encapsulant element(s) is structurally substantially identical to the entirety of the lighting device with the previous encapsulant element(s).

The expression "substantially surround", as used herein, (e.g., in the expression "the removable encapsulant element can substantially surround the solid state light emitter") means that the first structure that "substantially surrounds" a second structure substantially envelopes the second structure in three dimensions, i.e., at least 95 percent of all rays extending from a point in the second structure and defining an angle of at least one degree relative to any other ray would pass through a portion of the first structure.

The expression "releasably held in place", as used herein, (e.g., in the expression "the first holding element structure can be releasably held in place relative to the second holding element structure") means that the element (e.g., one or more encapsulant elements) that is characterized as being releasably held in place can be released (e.g., so that it can be moved away, pivoted, slid, etc.) without structurally changing any other component, e.g., a clip or other structure that is holding a first structure in place relative to a second structure can be pushed to a location where it no longer holds the first structure in place relative to a second structure, and the clip (or other structure) automatically returns to its original position or can be moved back to its original position.

The term "saturated", as used herein, means having a purity of at least 85%, the term "purity" having a well-known meaning to persons skilled in the art, and procedures for calculating purity being well-known to those of skill in the art.

The present inventive subject matter further relates to an illuminated enclosure (the volume of which can be illuminated uniformly or non-uniformly), comprising an enclosed space and at least one lighting device according to the present inventive subject matter, wherein the lighting device illuminates at least a portion of the enclosed space (uniformly or non-uniformly).

Some embodiments of the present inventive subject matter comprise at least a first power line, and some embodiments of the present inventive subject matter are directed to a structure comprising a surface and at least one lighting device corresponding to any embodiment of a lighting device according to the present inventive subject matter as described herein, wherein if current is supplied to the first power line, and/or if at least one solid state light emitter in the lighting device is illuminated, the lighting device would illuminate at least a portion of the surface.

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device as described herein.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As noted above, according to one aspect of the present inventive subject matter, there is provided a lighting device that comprises one or more solid state light emitters and one or more removable encapsulant elements.

The following discussion of solid state light emitters applies to the solid state light emitters that can be included in any of the lighting device elements or lighting devices according to the present inventive subject matter.

Persons of skill in the art are familiar with, and have ready access to, a wide variety of solid state light emitters, and any suitable solid state light emitter (or solid state light emitters) can be employed in the lighting devices or lighting device elements according to the present inventive subject matter. Representative examples of solid state light emitters include light emitting diodes (inorganic or organic, including polymer light emitting diodes (PLEDs)) and a wide variety of luminescent materials as well as combinations (e.g., one or more light emitting diodes and/or one or more luminescent materials).

Persons of skill in the art are familiar with, and have ready access to, a variety of solid state light emitters that emit light having a desired peak emission wavelength and/or dominant emission wavelength, and any of such solid state light emitters (discussed in more detail below), or any combinations of such solid state light emitters, can be employed in embodiments that comprise a solid state light emitter.

Solid state light emitters, such as LEDs, may be energy efficient, so as to satisfy ENERGY STAR® program requirements. ENERGY STAR program requirements for LEDs are defined in "ENERGY STAR® *Program Requirements for Solid State Lighting Luminaires, Eligibility Criteria—Version* 1.1", Final: Dec. 19, 2008, the disclosure of which is hereby incorporated herein by reference in its entirety as if set forth fully herein.

The one or more solid state light emitters can be selected based on the electromagnetic radiation (light) desired, e.g., they can emit infrared light, visible light, ultraviolet light, near ultraviolet light, etc., and any combinations thereof.

Solid state light emitters employed in the lighting devices and lighting arrangements according to the present inventive subject matter can be selected from among solid state light emitters that have any suitable or desired full width half max (FWHM) values. Persons of skill in the art are familiar with FWHM values for solid state light emitters (e.g., representative, non-limiting values of typical InGaN and AlInGaP light emitting diodes are about 17 nm for red light-emitting solid state light emitters, about 32 nm for green light-emitting solid state light emitters and 20 nm for blue light-emitting solid state light emitters).

The solid state light emitters can include emitters that emit light that is nearly saturated or non-saturated.

The lighting devices or lighting device elements according to the present inventive subject matter can comprise any desired number of solid state light emitters (and/or any amount of luminescent material or number of lumiphors). For example, a lighting device according to the present inventive subject matter can include 50 or more light emitting diodes, or can include 100 or more light emitting diodes, etc. Other embodiments may include fewer light emitting diodes, and such could be small chip light emitting diodes or high power light emitting diodes, and, provided with sufficient heatsinking, could be operated at high currents. Some embodiments may include fewer light emitting diodes, e.g., as little as a single light emitting diode, or one each of blue and red, and such could be small chip light emitting diodes or high power light emitting diodes, and, provided with sufficient heatsinking, could be operated at high currents. In the case of high power light emitting diodes, operating up to 5 A (or higher) is possible.

Light emitting diodes are semiconductor devices that convert electrical current into light. A wide variety of light emitting diodes are used in increasingly diverse fields for an ever-expanding range of purposes. More specifically, light emitting diodes are semiconducting devices that emit light (ultraviolet, visible, or infrared) when a potential difference is applied across a p-n junction structure. There are a number of well known ways to make light emitting diodes and many associated structures, and the present inventive subject matter can employ any such devices.

A light emitting diode produces light by exciting electrons across the band gap between a conduction band and a valence band of a semiconductor active (light-emitting) layer. The electron transition generates light at a wavelength that depends on the band gap. Thus, the color of the light (wavelength) (and/or the type of electromagnetic radiation, e.g., infrared light, visible light, ultraviolet light, near ultraviolet light, etc., and any combinations thereof) emitted by a light emitting diode depends on the semiconductor materials of the active layers of the light emitting diode.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

Examples of emitters suitable for the present inventive subject matter include varieties of light emitting diode chips with associated conductive vias and pads for electrical attachment and that are emissive principally at P-N or N-P junctions within doped inorganic compounds of AlGaAs, AlInGaP, GaAs, GaP, InGaN, AlInGaN, GaN, SiC, ZnSe and the like.

The removable encapsulant element (or, in lighting devices that comprise two or more encapsulant elements, each of the removable encapsulant elements) can be generally any at least partially translucent or partially transparent structure, and in lighting devices according to the present inventive subject matter, can be located anywhere that light emitted by the one or more solid state light emitter (when it/they is/are emitting light) enters the removable encapsulant element. For example, the removable encapsulant element can completely surround the solid state light emitter, the removable encapsulant element can substantially surround the solid state light emitter, or the removable encapsulant element can not surround the solid state light emitter (e.g., of all the directions extending from the solid state light emitter and spaced at least five degrees from each other, any portion of such directions can pass through the removable encapsulant element), and the removable encapsulant element can be spaced from the solid state light emitter, in indirect contact with the solid state light emitter, or in direct contact with the solid state light emitter. In some embodiments, the removable encapsulant element can protect one or more solid state light emitter. In embodiments that include more than one encapsulant element (one or more of which can be removable), any number of the encapsulant elements can be removable.

The removable encapsulant element can be of any suitable shape and size. In embodiments that include more than one encapsulant element, the encapsulant elements can all be of similar size and shape, or the lighting device can include encapsulant elements of two or more sizes and/or shapes, and there can be one or more encapsulant elements of each size and shape.

The removable encapsulant element (or, in lighting devices that comprise two or more encapsulant elements, each of the encapsulant elements) can be made of any suitable material or materials. In embodiments that include more than one encapsulant element, the encapsulant elements can all be made of the same material or materials, or the lighting device can include encapsulant of two or more different materials (or combinations of materials), and there can be one or more encapsulant elements of each material (or combination of materials). In most instances, the encapsulant element (or the encapsulant elements) is/are substantially transparent (except to the extent that they may contain one or more luminescent materials, such that some light entering them is absorbed by the luminescent material(s) and is re-emitted by the luminescent material(s)). A representative example of material out of which an encapsulant element can be made (or that an encapsulant material can comprise) is a polymeric matrix, such as a silicone material, an epoxy material, a glass material or a metal oxide material.

In some embodiments, which can include or not include (as suitable) any of the other features described herein, the removable encapsulant element can be deformable (e.g., it can comprise silicone rubber). In some of such embodiments, an interface between one or more solid state light emitter (e.g., an LED chip) and the removable encapsulant element is substantially or completely without a gap, whereby optical coupling is good. In some of such embodiments, the deformable encapsulant element can be compressed, e.g., within an encapsulant holding element.

In some embodiments, which can include or not include (as suitable) any of the other features described herein, a grease (which can be substantially transparent) and/or a deformable film and/or liquid (which can be substantially transparent) can be located between one or more solid state light emitter (e.g., an LED chip) and the removable encapsulant element, which can improve optical coupling.

As noted above, the removable encapsulant element (or, in lighting devices that comprise two or more encapsulant elements, one or more of the encapsulant elements) can comprise one or more luminescent materials. Any encapsulant elements that comprise luminescent material can have one or more luminescent material positioned in any suitable way, e.g., dispersed generally evenly (or unevenly, or randomly, or in a graded manner) throughout the encapsulant element or a region of the encapsulant element, or luminescent material can be concentrated in one or more regions within the encapsulant element, e.g., there can be one or more regions that contain at least 50 percent (and in some cases at least 60 percent, at least 70 percent, at least 80 percent, at least 90 percent, at least 95 percent or at least 98 percent) of the luminescent material. For example, one or more luminescent materials can be embedded in an encapsulant element (e.g., a polymeric matrix, such as a silicone material, an epoxy material, a glass material or a metal oxide material), and/or can be applied to one or more surfaces of an encapsulant element.

Inclusion of luminescent materials in encapsulant material can be accomplished by adding the luminescent materials to a clear or translucent encapsulant material (e.g., epoxy-based, silicone-based, glass-based or metal oxide-based material) as discussed above. For example, luminescent material can be blended in encapsulant material prior to solidifying the encapsulant material, or by blending or coating on an encapsulant material prior to solidifying, while solidifying or after solidifying the encapsulant material.

With regard to lighting devices that comprise one or more encapsulant elements that comprise one or more luminescent material, depending on the overall thickness of the encapsulant element, the weight percentage of the luminescent material could be generally any value, e.g., from 0.1 weight percent to 100 weight percent (e.g., an element formed by subjecting pure phosphor to a hot isostatic pressing procedure). Any encapsulant element can further comprise any of a number of well known additives, e.g., diffusers, scatterers, tints, etc.

In summary, therefore, lighting devices according to the present inventive subject matter can comprise one or more encapsulant elements:

at least one of which is removable;

each of which individually comprises any suitable material or materials;

each of which individually is of any suitable size and shape; and each of which may or may not comprise one or more luminescent materials.

In addition, in some embodiments, one or more luminescent materials can be provided in any other component or components within the lighting device, as suitable. In some embodiments, for instance, luminescent material can be provided in or on a light control element, in or on a diffusion element, in or on an obscuration element, in or on a housing member, in or on a reflector, etc. In embodiments where luminescent material is provided on a surface of an element, the luminescent material can be provided on either (or both) surfaces.

A luminescent material is a material that emits a responsive radiation (e.g., visible light) when excited by a source of exciting radiation. In many instances, the responsive radiation has a wavelength that is different from the wavelength of the exciting radiation.

Luminescent materials can be categorized as being down-converting, i.e., a material that converts photons to a lower energy level (longer wavelength) or up-converting, i.e., a material that converts photons to a higher energy level (shorter wavelength).

One type of luminescent material are phosphors, which are readily available and well known to persons of skill in the art. Other examples of luminescent materials include scintillators, day glow tapes and inks that glow in the visible spectrum upon illumination with ultraviolet light.

Persons of skill in the art are familiar with, and have ready access to, a variety of luminescent materials that emit light having a desired peak emission wavelength and/or dominant emission wavelength, or a desired hue, and any of such luminescent materials, or any combinations of such luminescent materials, can be employed, if desired.

The advantage of providing a wider spectrum of visible wavelengths to provide increased CRI (e.g., Ra) is well known, and the ability to predict the perceived color of output light from a lighting device that includes light emitters that output two or more respective colors of light is also well known, e.g., with the assistance of the CIE color charts.

In embodiments where the lighting device includes one or more luminescent materials, the expression "illuminated" (or "illumination" or the like) can include light that has been up-converted or down-converted by one or more luminescent materials.

In general, light of any number of colors can be mixed by the lighting devices according to the present inventive subject matter.

Some embodiments according to the present inventive subject matter provide a lighting device that comprises at least one solid state light emitter that, if energized, emits BSY light (e.g., a solid state light emitter which can include one or more light emitting diodes and one or more luminescent materials), and at least one solid state light emitter that, if energized, emits light that is not BSY light.

The expression "BSY light", as used herein, means light having x, y color coordinates which define a point which is within (1) an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38, and/or (2) an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53.

The one or more solid state light emitters can be arranged in any suitable way.

Some embodiments according to the present inventive subject matter can include solid state light emitters that emit light of a first hue (e.g., light within the BSY range) and solid state light emitters that emit light of a second hue (e.g., that is not within the BSY range, such as red or reddish or reddish orange or orangish, or orange light), where each of the solid state light emitters that emits light that is not BSY light is surrounded by five or six solid state light emitters that emit BSY light.

Some embodiments according to the present inventive subject matter comprise a first group of one or more solid state light emitters that, if energized, emit BSY light, and a second group of one or more solid state light emitters that, if energized, emit light that is not BSY light, the first and second groups of light emitting diodes are mounted on a first solid state light emitter support member, and an average distance between a center of each solid state light emitter in the first group and a closest point on an edge region of the first solid state light emitter support member is smaller than an average distance between a center of each solid state light emitter in the second group and a closest point on an edge region of the first solid state light emitter support member.

In some embodiments, solid state light emitters (e.g., where a first group includes solid state light emitters that emit non-BSY light, e.g., red, reddish, reddish-orange, orangish or orange light, and a second group includes solid state light emitters that emit BSY light) may be arranged pursuant to a guideline described below in paragraphs (1)-(5), or any combination of two or more thereof, to promote mixing of light from solid state light emitters emitting different colors of light:

(1) an array that has groups of first and second solid state light emitters with the first group of solid state light emitters arranged so that no two of the first group solid state light emitters are directly next to one another in the array;

(2) an array that comprises a first group of solid state light emitters and one or more additional groups of solid state light emitters, the first group of solid state light emitters arranged so that at least three solid state light emitters from the one or more additional groups is adjacent to each of the solid state light emitters in the first group;

(3) an array that comprises a first group of solid state light emitters and one or more additional groups of solid state light emitters, and the array is arranged so that less than fifty percent (50%), or as few as possible, of the solid state light emitters in the first group of solid state light emitters are on the perimeter of the array;

(4) an array that comprises a first group of solid state light emitters and one or more additional groups of solid state light emitters, and the first group of solid state light emitters is arranged so that no two solid state light emitters from the first group are directly next to one another in the array, and so that at least three solid state light emitters from the one or more additional groups is adjacent to each of the solid state light emitters in the first group; and/or (5) an array that is arranged so that no two solid state light emitters from the first group are directly next to one another in the array, fewer than fifty percent (50%) of the solid state light emitters in the first group of solid state light emitters are on the perimeter of the array, and at least three solid state light emitters from the one or more additional groups are adjacent to each of the solid state light emitters in the first group.

It is understood that arrays according to the present inventive subject matter can also be arranged in other ways, and can have additional features, that promote color mixing. In some embodiments, solid state light emitters can be arranged so that they are tightly packed, which can further promote natural color mixing. The lighting device can also comprise different diffusers and reflectors to promote color mixing in the near field and in the far field.

As noted above, some embodiments of the present inventive subject matter can further comprise at least a first encapsulant holding element. The first encapsulant holding element can be any of a wide variety of structures (or combinations of structures) that can hold the first removable encapsulant element (or one or more of plural removable encapsulant elements) where at least some light emitted by the first solid state light emitter enters the first removable encapsulant element. Persons of skill in the art can envision a wide variety of structures that can be used as an encapsulant holding element (or as one component of one or more encapsulant holding elements), and any of such structures can be employed in the lighting devices according to the present inventive subject matter.

Some embodiments of the present inventive subject matter comprise only a single encapsulant element (in such embodiments, the single encapsulant element is removable).

In some embodiments, the removable encapsulant element (or, where there are plural encapsulant elements, at least one of the encapsulant elements) can be held in place relative to the one or more solid state light emitters by a single encapsulant holding element or by two or more encapsulant holding elements.

In embodiments that include more than one encapsulant element (at least one of which is removable), a single encapsulant holding element can hold more than one encapsulant element, and/or two or more encapsulant holding elements can hold an encapsulant element, and/or a single encapsulant holding element can hold an encapsulant element.

Some embodiments according to the present inventive subject matter can comprise an encapsulant holding element that comprises at least first and second holding element structures, with at least one encapsulant element between the first holding element structure and the second holding element structure. For example, such an encapsulant holding element can comprise a first holding element structure that is transparent, substantially transparent or partially transparent (e.g., a lens, an encapsulant, a diffuser, a light control film, a protective cover, etc., formed of any suitable material, e.g. formed of glass, ceramic material, plastic, etc., and in the shape of, e.g., a dome, a rectangle, a five-sided shape corresponding to five sides of a hollow parallelepiped, etc.) and a second holding element structure that is a substrate on which one or more solid state light emitter is mounted, with an encapsulant element (or two or more encapsulant elements) between the first holding element structure and the second holding element structure.

In some embodiments, which can include or not include, as suitable, any of the other features described herein, at least one holding element can be releasably held in place relative to at least one other holding element, e.g., by being clipped to the other holding element(s), by sliding into engagement with the other holding element(s), by seating in or on the other holding element(s), by being glued to the other holding element(s), by being pressed into or onto the other holding element(s), by being threaded into or onto the other holding element(s), by the inclusion of one or more connectors (e.g., one or more screws, bolts, rivets, staples, etc.) that extend through at least a portion of one holding element and through at least a portion of another holding element, by being pushed by a spring or a tension member into or onto the other holding element(s), by being pushed together by gravity, by being held together by magnetism, by being geometrically engaged (e.g., by a ratcheting mechanism, by engaging surfaces, such as an internal frustoconical surface in which an external frustoconical surface seats, etc.).

In some embodiments, which can include or not include, as suitable, any of the other features described herein, a slightly oversized encapsulant element (or group of encapsulant elements) can be compressed between at least first and second holding element structures so that the compressed encapsulant element exerts pressure that pushes the holding elements into engagement.

In some embodiments, which can include or not include, as suitable, any of the other features described herein, the encapsulant holding member (or at least one holding member, e.g., a substrate on which one or more solid state light emitters is/are mounted) can comprise one or more electrically conductive regions, e.g., one or more conductive traces and/or one or more wire bonds.

In some embodiments, which can include or not include, as suitable, any of the other features described herein, the at least one encapsulant holding element substantially surrounds at least the first removable encapsulant element. The expression "the at least one encapsulant holding element substantially surrounds at least the first removable encapsulant element" means that the at least one encapsulant holding element substantially completely envelopes the first removable encapsulant element in three dimensions, i.e., at least 95 percent of all rays extending from a point in the first removable encapsulant element and defining an angle of at least one degree relative to any other ray would pass through a portion of the encapsulant holding element.

In some embodiments, solid state light emitters can be mounted (e.g., on one or more encapsulant holding elements or on any other structure in the lighting device) in any suitable way, e.g., by using chip on heat sink mounting techniques, by soldering (e.g., if the encapsulant holding element comprises a metal core printed circuit board (MCPCB), flex circuit or even a standard PCB, such as an FR4 board), for example, solid state light emitters can be mounted using substrate techniques such as from Thermastrate Ltd of Northumberland, UK. If desired, the surface of the structure on which the solid state light emitter(s) is/are mounted and/or the one or more solid state light emitters can be machined or otherwise formed to be of matching topography so as to provide high heat sink surface area.

In some embodiments, solid state light emitter(s) can be mounted on one or more structures that can be made of any suitable material (or combination of materials) (and persons of skill in the art are familiar with a variety of suitable materials), and that can be of any suitable shape and/or size.

In some embodiments, which can include or not include, as suitable, any of the other features described herein, one or more solid state light emitters can be mounted on one or more structures that comprise conductive regions that supply electricity to the one or more solid state light emitters, and optionally to other circuitry, as suitable. For instance, in some of such embodiments, one or more solid state light emitters can be mounted on a circuit board.

Some embodiments in accordance with the present inventive subject matter (which can include or not include any of the features described elsewhere herein) include one or more lenses, diffusers or light control elements. Persons of skill in the art are familiar with a wide variety of lenses, diffusers and light control elements, can readily envision a variety of materials out of which a lens, a diffuser, or a light control element can be made (e.g., polycarbonate materials, acrylic materials, fused silica, polystyrene, etc.), and are familiar with and/or can envision a wide variety of shapes that lenses, diffusers and light control elements can be. Any of such materials and/or shapes can be employed in a lens and/or a diffuser and/or a light control element in an embodiment that includes a lens and/or a diffuser and/or a light control element. As will be understood by persons skilled in the art, a lens or a diffuser or a light control element in a lighting device according to the present inventive subject matter can be selected to have any desired effect on incident light (or no effect), such as focusing, diffusing, etc. Any such lens and/or diffuser and/or light control element can comprise one or more luminescent materials, e.g., one or more phosphor.

In embodiments in accordance with the present inventive subject matter that include a lens (or plural lenses), the lens (or lenses) can be in any suitable location and orientation.

In embodiments in accordance with the present inventive subject matter that include a diffuser (or plural diffusers), the diffuser (or diffusers) can be in any suitable location and orientation. In some embodiments, which can include or not include any of the features described elsewhere herein, a diffuser can be provided over a top or any other part of the lighting device. In some embodiments, which can include or not include any of the features described elsewhere herein, a diffuser can be provided over a top or any other part of the lighting device, and the diffuser can comprise one or more luminescent material (e.g., in particulate form) spread throughout a portion of the diffuser or an entirety of the diffuser. A diffuser can be included in the form of a diffuser film/layer that is arranged to mix light emission from solid state light emitters in the near field. That is, a diffuser can mix the emission of solid state light emitters, such that when the lighting device is viewed directly, the light from the discrete solid state light emitters is not separately identifiable.

A diffuser film (if employed) can comprise any of many different structures and materials arranged in different ways, e.g., it can comprise a conformally arranged coating over a lens. In some embodiments, commercially available diffuser films can be used such as those provided by Bright View Technologies, Inc. of Morrisville, N.C., Fusion Optix, Inc. of Cambridge, Mass., or Luminit, Inc. of Torrance, Calif. Some of these films can comprise diffusing microstructures that can comprise random or ordered micro lenses or geometric features and can have various shapes and sizes. A diffuser film can be sized to fit over all or less than all of a lens, and can be bonded in place over a lens using known bonding materials and methods. For example, a film can be mounted to a lens with an adhesive, or could be film insert molded with a lens. In other embodiments, a diffuser film can comprise scattering particles, or can comprise index photonic features, alone or in combination with microstructures. A diffuser film can have any of a wide range of suitable thicknesses (some diffuser films are commercially available in a thickness in the range of from 0.005 inches to 0.125 inches, although films with other thicknesses can also be used).

In other embodiments, a diffuser and/or scattering pattern can be directly patterned onto a component, e.g., a lens. Such a pattern may, for example, be random or a pseudo pattern of surface elements that scatter or disperse light passing through them. The diffuser can also comprise microstructures within the component (e.g., lens), or a diffuser film can be included within the component (e.g., lens).

Diffusion and/or light scattering can also be provided or enhanced through the use of additives, a wide variety of which are well known to persons of skill in the art. Any of such additives can be contained in a lumiphor, in an encapsulant, and/or in any other suitable element or component of the lighting device.

In embodiments in accordance with the present inventive subject matter that include a light control element (or plural light control elements), the light control element (or light control elements) can be in any suitable location and orientation. Persons of skill in the art are familiar with a variety of light control elements, and any of such light control elements can be employed. For example, representative light control elements are described in U.S. Patent Application No. 61/245,688, filed on Sep. 25, 2009, the entirety of which is hereby incorporated by reference as if set forth in its entirety.

A light control element (or elements) can be any structure or feature that alters the overall nature of a pattern formed by light emitted by a light source. As such, the expression "light control element", as used herein, encompasses, e.g., films and lenses that comprise one or more volumetric light control structures and/or one or more surface light control features.

In addition, one or more scattering elements (e.g., layers) can optionally be included in the lighting devices according to the present inventive subject matter. For example, a scattering element can be included in a lumiphor, and/or a separate scattering element can be provided. A wide variety of separate scattering elements are well known to those of skill in the art, and any such elements can be employed in the lighting devices of the present inventive subject matter. Particles made from different materials can be used to make a scattering element, such as titanium dioxide, alumina, silicon carbide, gallium nitride, or glass micro spheres, e.g., with the particles dispersed within a lens.

Persons of skill in the art are familiar with, and have ready access to, a wide variety of filters, and any suitable filter (or filters), or combinations of different types of filters, can be employed in accordance with the present inventive subject matter. Such filters can include (1) pass-through filters, i.e., filters in which light to be filtered is directed toward the filter, and some or all of the light passes through the filter (e.g., some of the light does not pass through the filter) and the light that passes through the filter is the filtered light, (2) reflection filters, i.e., filters in which light to be filtered is directed toward the filter, and some or all of the light is reflected by the filter (e.g., some of the light is not reflected by the filter) and the light that is reflected by the filter is the filtered light, and (3) filters that provide a combination of both pass-through filtering and reflection filtering.

Lighting devices according to the present inventive subject matter can comprise one or more housing members, and/or can be within one or more housing members.

A housing member can be of any suitable shape and size, and can be made of any suitable material or materials. Persons of skill in the art are familiar with, and can envision, a wide variety of materials out of which a housing can be constructed (for example, a metal, a ceramic material, a plastic material with low thermal resistance, or combinations thereof), and a wide variety of shapes for such housings, and housings made of any of such materials and having any of such shapes can be employed in accordance with the present inventive subject matter.

In some embodiments, a housing member can comprise one or more heat dissipation regions, e.g., one or more heat dissipation fins, or any other structure that provides or enhances any suitable thermal management scheme.

In some embodiments, a housing member is shaped so that it can accommodate any of a variety of components, e.g., components involved in thermal management, components involved in receiving current supplied to a lighting device, modifying the current (e.g., converting it from AC to DC and/or from one voltage to another voltage), and/or driving one or more solid state light emitters (e.g., illuminating one or more solid state light emitter intermittently and/or adjusting the current supplied to one or more solid state light emitters in response to a detected operating temperature of one or more solid state light emitter, a detected change in intensity or color of light output, a detected change in an ambient characteristic such as temperature or background light, a user command, etc., and/or a signal contained in the input power, such as a dimming signal in AC power supplied to the lighting device).

Lighting devices according to the present inventive subject matter can comprise one or more mixing chamber elements, and/or can be attached to one or more trim elements and/or one or more fixture elements A mixing chamber element (if included) can be of any suitable shape and size, and can be made of any suitable material or materials. Light emitted by the one or more solid state light emitters can be mixed to a suitable extent in a mixing chamber before exiting the lighting device.

Representative examples of materials that can be used for making a mixing chamber element include, among a wide variety of other materials, spun aluminum, stamped aluminum, die cast aluminum, rolled or stamped steel, hydroformed aluminum, injection molded metal, injection molded thermoplastic, compression molded or injection molded thermoset, molded glass, liquid crystal polymer, polyphenylene sulfide (PPS), clear or tinted acrylic (PMMA) sheet, cast or injection molded acrylic, thermoset bulk molded compound or other composite material. In some embodiments, a mixing chamber element can consist of or can comprise a reflective element (and/or one or more of its surfaces can be reflective). Such reflective elements (and surfaces) are well-known and readily available to persons skilled in the art. A representative example of a suitable material out of which a reflective element can be made is a material marketed by Furukawa (a Japanese corporation) under the trademark MCPET®.

In some embodiments, a mixing chamber can be defined (at least in part) by a mixing chamber element. In some embodiments, a mixing chamber can be defined in part by a mixing chamber element (and/or by a trim element) and in part by a lens and/or a diffuser. In some embodiments, a housing member and a mixing chamber element can be integral. The expression "defined (at least in part)", e.g., as used in the expression "mixing chamber is defined (at least in part) by a mixing chamber element" means that the element or feature that is defined "at least in part" by a particular structure is defined completely by that structure or is defined by that structure in combination with one or more additional structures.

A trim element (if included) can be of any suitable shape and size, and can be made of any suitable material or materials. Representative examples of materials that can be used for making a trim element include, among a wide variety of other materials, spun aluminum, stamped aluminum, die cast aluminum, rolled or stamped steel, hydroformed aluminum, injection molded metal, iron, injection molded thermoplastic, compression molded or injection molded thermoset, glass (e.g., molded glass), ceramic, liquid crystal polymer, polyphenylene sulfide (PPS), clear or tinted acrylic (PMMA) sheet, cast or injection molded acrylic, thermoset bulk molded compound or other composite material. In some embodiments that include a trim element, the trim element can consist of or can comprise a reflective element (and/or one or more of its surfaces can be reflective). Such reflective elements (and surfaces) are well known and readily available to persons skilled in the art. A representative example of a suitable material out of which a reflective element can be made is a material marketed by Furukawa (a Japanese corporation) under the trademark MCPET®.

In some embodiments according to the present inventive subject matter, a mixing chamber element can be provided which comprises a trim element (e.g., a single structure can be provided which acts as a mixing chamber element and as a trim element, a mixing chamber element can be integral with a trim element, and/or a mixing chamber element can comprise a region that functions as a trim element). In some embodiments, such structure can also comprise some or all of a thermal management system for the lighting device. By providing such a structure, it is possible to reduce or minimize the thermal interfaces between the solid state light emitter(s) and the ambient environment (and thereby improve heat transfer), especially, in some cases, in devices in which a trim element acts as a heat sink for light source(s) (e.g., solid state light emitters) and is exposed to a room. In addition, such a structure can eliminate one or more assembly steps, and/or reduce parts count. In such lighting devices, the structure (i.e., the combined mixing chamber element and trim element) can further comprise one or more reflector and/or reflective film, with the structural aspects of the mixing chamber element being provided by the combined mixing chamber element and trim element).

A fixture element, when included, can comprise a fixture housing, a mounting structure, an enclosing structure, and/or any other suitable structure. Persons of skill in the art are familiar with, and can envision, a wide variety of materials out of which such fixture elements can be constructed, and a wide variety of shapes for such fixture elements. Fixture elements made of any of such materials and having any of such shapes can be employed in accordance with the present inventive subject matter.

In some embodiments, a fixture element, if provided, can further comprise an electrical connector that engages an electrical connector on the lighting device or that is electrically connected to the lighting device In some embodiments that include a fixture element, an electrical connector can be provided that is substantially non-moving relative to the fixture element, e.g., the force normally employed when installing an Edison plug in an Edison socket does not cause the Edison socket to move more than one centimeter relative to the fixture element, and in some embodiments, not more than ½ centimeter (or not more than ¼ centimeter, or not more than one millimeter, etc.). In some embodiments, an electrical connector that engages an electrical connector on the lighting device can move relative to a fixture element, and structure can be provided to limit movement of the lighting device relative to the fixture element (e.g., as disclosed in U.S. patent application Ser. No. 11/877,038, filed Oct. 23, 2007 (now U.S. Patent Publication No. 2008/0106907, the entirety of which is hereby incorporated by reference as if set forth in its entirety).

In some embodiments, one or more structures can be attached to a lighting device that engage structure in a fixture element to hold the lighting device in place relative to the fixture element. In some embodiments, the lighting device can be biased against a fixture element, e.g., so that a flange portion of a trim element is maintained in contact (and forced against) a bottom region of a fixture element (e.g., a circular extremity of a cylindrical can light housing). Additional examples of structures that can be used to hold a lighting device in place relative to a fixture element are disclosed in U.S. patent application Ser. No. 11/877,038, filed Oct. 23, 2007 (now U.S. Patent Publication No. 2008/0106907), the entirety of which is hereby incorporated by reference as if set forth in its entirety).

The lighting devices of the present inventive subject matter can be arranged in generally any suitable orientation, a variety of which are well known to persons skilled in the art. For example, the lighting device can be a back-reflecting device or a front-emitting device.

Persons of skill in the art are familiar with, and can readily envision, and have ready access to, a variety of reflective elements, and any of such reflective elements can be employed in embodiments in accordance with the present inventive subject matter. Persons of skill in the art are familiar with, and can readily obtain, a wide variety of reflective materials for use in such reflective elements.

A reflector can comprise one or more reflector elements (each reflector element being an integral structure that is separate from, i.e., not integral with, any other reflector element), each of which can be made of any suitable material or materials. Lighting devices that comprise more than one reflector regions can comprise any number of reflector devices that each respectively has any desired combinations of the reflector regions. In addition, any particular reflector region can comprise any desired number of reflector elements (e.g., a first reflector region can comprise first and second reflector elements; or a first reflector region can comprise a first part of a first reflector element and a first part of a second reflector element, and a second reflector region can comprise a second part of the first reflector element and a second part of the second reflector element).

The ability of a reflector to reflect light can be imparted in any suitable way, a variety of which are well known to persons of skill in the art. For example, the reflector(s) can comprise one or more material that is reflective (and/or specular, the term "reflective" being used herein to refer to reflective and optionally also specular), and/or that can be treated (e.g., polished) so as to be reflective, or can comprise one or more material that is non-reflective or only partially reflective and that is coated with, laminated to and/or otherwise attached to a reflective material. Persons of skill in the art are familiar with a variety of materials that are reflective, e.g., metals such as aluminum or silver, a dielectric stack of materials forming a Bragg Reflector, a dichroic reflector coating on glass (e.g., as described at www.lumascape.com/pdf/literature/C1087US.pdf), any other thin film reflectors, etc. Persons of skill in the art are familiar with a wide variety of materials which are suitable for making a non-reflective or partially reflective structure which can be coated with, laminated to or otherwise attached to a reflective material, including for instance plastic materials such as polyethylene, polypropylene, natural or synthetic rubbers, polycarbonate or polycarbonate copolymer, PAR (poly(4,4'-isopropylidenediphenylene terephthalate/isophthalate) copolymer), PEI (polyetherimide), and LCP (liquid crystal polymer). The reflector(s) can be formed out of highly reflective aluminum sheet with various coatings, including silver, from companies like Alanod (http://www.alanod.de/opencms/alanod/index.html_2063069299.html.), or the reflector(s) can be formed from glass. In cases where a lighting device according to the present inventive subject matter comprises more than one reflector, the respective reflectors can be made of the same material, or any reflector(s) can be made of different materials.

Representative examples of suitable arrangements of reflectors include back-reflectors, in which an axis of light from at least one light emitter is reflected at least 90 degrees, e.g., close to or equal to 180 degrees, and forward reflectors, in which an axis of light from at least one light emitter is reflected at least 90 degrees (e.g., close to or equal to 180 degrees) a first time, and is then reflected again by at least 90 degrees (e.g., close to or equal to 180 degrees) a second time (whereby, in some cases, the axis of light is again traveling in substantially the same direction it was before being reflected for the first time).

Representative examples of suitable reflectors (and arrangements thereof) are described in many patents, e.g., U.S. Pat. Nos. 6,945,672, 7,001,047, 7,131,760, 7,214,952 and 7,246,921 (the entireties of which are hereby incorporated by reference), each of which describes, inter alia, back-reflectors.

A reflector can include cusps and/or facets, as known in the art. In some embodiments, a reflector can have an M-shaped contour, as also known in the art. In some embodiments, a reflector (or reflectors) can collect light emitted from solid state light emitters and reflect the light so that it does not strike the light emitters) and/or structure on which the light emitter(s) is/are mounted (e.g., a bridge), e.g., in some embodiments, the reflector is contoured and the cusps or facets are shaped such that light striking the reflector behind the bridge is directed to either side of the bridge. See, e.g., U.S. Pat. No. 7,131,760. Furthermore, in some embodiments, a reflector can be contoured and cusps or facets shaped such that light striking a reflector not directly behind a bridge is directed to the center of the light beam's pattern and to fill in other areas of the beam that may be deficient. Each cusp or facet can be individually aimed so that light reflected from the reflector(s) forms a desired beam pattern while avoiding striking the bridge or the light emitter.

Any desired circuitry, including any desired electronic components, can be employed in order to supply energy to the one or more solid state light emitters according to the present inventive subject matter.

Some embodiments of lighting devices according to the present inventive subject matter can comprise one or more power supply and/or one or more driver which can receive AC voltage (e.g., line voltage) and convert that voltage to a voltage and/or current suitable for driving solid state light emitters. Representative examples of power supplies for light emitting diode light sources include linear current regulated supplies and/or pulse width modulated current and/or voltage regulated supplies.

Various electronic components (if provided in the lighting devices) can be mounted in any suitable way. For example, in some embodiments, light emitting diodes can be mounted on a first circuit board (a "light emitting diode circuit board") and electronic circuitry that can convert AC line voltage into DC voltage suitable for being supplied to light emitting diodes can be mounted on a separate element (e.g., a "driver circuit board"), whereby line voltage is supplied to the electrical connector and passed along to a driver circuit board, the line voltage is converted to DC voltage suitable for being supplied to light emitting diodes in the driver circuit board, and the DC voltage is passed along to the light emitting diode circuit board where it is then supplied to the light emitting diodes. In some embodiments according to the present inventive subject matter, the solid state light emitter support member can comprise a metal core circuit board.

Some embodiments of lighting devices according to the present inventive subject matter can comprise one or more compensation circuits to help to ensure that the perceived color (including color temperature in the case of "white" light) of the light exiting a lighting device is accurate (e.g., within a specific tolerance). Such compensation circuits, if included, can (for example) adjust the current supplied to solid state light emitters that emit light of one color and/or separately adjust the current supplied to solid state light emitters that emit light of a different color, so as to adjust the color of mixed light emitted from lighting devices, and such adjustment(s) can be (1) based on temperature sensed by one or more temperature sensors (if included), and/or (2) based on light emission as sensed by one or more light sensors (if included) (e.g., based on one or more sensors that detect (i) the color of the light being emitted from the lighting device, and/or (ii) the intensity of the light being emitted from one or more of the solid state light emitters, and/or (iii) the intensity of light of one or more specific hues of color), and/or based on any other sensors (if included), factors, phenomena, etc.

A wide variety of compensation circuits are known, and any can be employed in the lighting devices according to the present inventive subject matter. For example, a compensation circuit may comprise a digital controller, an analog controller or a combination of digital and analog. For example, a compensation circuit may comprise an application specific integrated circuit (ASIC), a microprocessor, a microcontroller, a collection of discrete components or combinations thereof. In some embodiments, a compensation circuit may be programmed to control one or more solid state light emitters. In some embodiments, control of one or more solid state light emitters may be provided by the circuit design of the compensation circuit and is, therefore, fixed at the time of manufacture. In still further embodiments, aspects of the compensation circuit, such as reference voltages, resistance values or the like, may be set at the time of manufacture so as to allow adjustment of the control of the one or more solid state light emitters without the need for programming or control code.

Some embodiments of lighting devices according to the present inventive subject matter can comprise one or more color sensors.

Persons of skill in the art are familiar with a wide variety of color sensors, and any of such sensors can be employed in the lighting devices of the present inventive subject matter. Among these well known sensors are sensors that are sensitive to all visible light, as well as sensors that are sensitive to only a portion of visible light. For example, the sensor can be a unique and inexpensive sensor (GaP:N light emitting diode) that views the entire light flux but is only (optically) sensitive to one or more of a plurality of light emitting diodes. For instance, in one specific example, the sensor can be sensitive to only a particular range (or ranges) of wavelengths, and the sensor can provide feedback to one or more light sources (e.g., light emitting diodes that emit light of that color or that emit light of other colors) for color consistency, e.g., as the light sources age (and light output decreases), as temperature changes cause changes in emission, or as any other factor or factors cause changes in emission.

By using a sensor that monitors output selectively (by color), the output of one color can be selectively controlled to maintain the proper ratios of outputs and thereby maintain the color output of the device. This type of sensor is excited by only light having wavelengths within a particular range, e.g., a range that excludes red light.

Other techniques for sensing changes in light output of light sources include providing separate or reference emitters and a sensor that measures the light output of these emitters. These reference emitters can be placed so as to be isolated from ambient light such that they typically do not contribute to the light output of the lighting device. Additional techniques for sensing the light output of a light source include measuring ambient light and light output of the lighting device separately and then compensating the measured light output of the light source based on the measured ambient light.

Some embodiments of lighting devices according to the present inventive subject matter can comprise one or more temperature sensors.

Persons of skill in the art are familiar with, and have ready access to, a variety of temperature sensors (e.g., thermistors), and any of such temperature sensors can be employed in embodiments in accordance with the present inventive subject matter. Temperature sensors can be used for a variety of purposes, e.g., to provide feedback information to compensation circuitry, e.g., to current adjusters.

In some embodiments, one or more temperature sensors (e.g., a single temperature sensor or a network of temperature sensors) can be provided which are in contact with one or more solid state light emitters, or are close to one or more solid state light emitters (e.g., less than ¼ inch away), or on the same support or circuit board as the solid state light emitter(s), such that the temperature sensor(s) provide accurate readings of the temperature of the solid state light emitter(s).

In some embodiments, one or more temperature sensors (e.g., a single temperature sensor or a network of temperature sensors) can be provided which are not in contact with one or more solid state light emitters, and are not close to one or more solid state light emitters, but are spaced from the solid state light emitter (or solid state light emitters) by only structure (or structures) having low thermal resistance, such that the temperature sensor(s) provide accurate readings of the temperature of the solid state light emitter(s).

In some embodiments, one or more temperature sensors (e.g., a single temperature sensor or a network of temperature sensors) can be provided which are not in contact with one or more solid state light emitters, and are not close to one or more solid state light emitters, but the arrangement is such that the temperature at the temperature sensor(s) is proportional to the temperature at the solid state light emitter(s), or the temperature at the temperature sensor(s) varies in proportion to the variance of temperature at the solid state light emitter(s), or the temperature at the temperature sensor(s) is correlatable to the temperature at the solid state light emitter(s).

Lighting devices according to the present inventive subject matter can comprise one or more electrical connectors.

Various types of electrical connectors are well known to those skilled in the art, and any of such electrical connectors can be attached within (or attached to) the lighting devices according to the present inventive subject matter. Representative examples of suitable types of electrical connectors include wires (for splicing to a branch circuit), Edison plugs (i.e., Edison screw threads, which are receivable in Edison sockets) and GU24 pins (which are receivable in GU24 sockets).

An electrical connector, when included, can be electrically connected to one or more circuitry component included in the lighting device in any suitable way. A representative example of a way to electrically connect a circuitry component to an electrical connector is to connect a first portion of a flexible wire to the electrical connector and to connect a second portion of the flexible wire to a circuit board (e.g., a metal core circuit board) on which the circuitry component is mounted.

Some embodiments in accordance with the present inventive subject matter can comprise a power line that can be connected to a source of power (such as a branch circuit, an electrical outlet, a battery, a photovoltaic collector, etc.) and that can supply power to an electrical connector (or directly to an electrical contact, e.g., the power line itself can be an electrical connector). Persons of skill in the art are familiar with, and have ready access to, a variety of structures that can be used as a power line. A power line can be any structure that can carry electrical energy and supply it to an electrical connector on a lighting device and/or to a lighting device according to the present inventive subject matter.

Energy can be supplied to the lighting devices according to the present inventive subject matter from any source or combination of sources, for example, the grid (e.g., line voltage), one or more batteries, one or more photovoltaic energy collection devices (i.e., a device that includes one or more photovoltaic cells that convert energy from the sun into electrical energy), one or more windmills, etc.

In some embodiments according to the present inventive subject matter, the lighting device is a self-ballasted device. For example, in some embodiments, the lighting device can be directly connected to AC current (e.g., by being plugged into a wall receptacle, by being screwed into an Edison socket, by being hard-wired into a branch circuit, etc.).

In some embodiments, which can include or not include, as suitable, any of the other features described herein, lighting devices according to the present inventive subject matter can include any suitable thermal management components.

In some embodiments, which can include or not include, as suitable, any of the other features described herein, one or more heat spreaders can be provided in order to move heat away from the one or more solid state light emitters to one or more heat sink regions and/or one or more heat dissipation regions, and/or to provide surface area from which heat can be dissipated. Persons of skill in the art are familiar with a variety of materials that would be suitable for use in making a heat spreader, and any of such materials (e.g., copper, aluminum, etc.) can be employed.

Heat transfer from one structure or region of a lighting device to another can be enhanced (i.e., thermal resistivity can be reduced or minimized) using any suitable material or structure for doing so, a variety of which are known to persons of skill in the art, e.g., by means of chemical or physical bonding and/or by interposing a heat transfer aid such as a thermal pad, thermal grease, graphite sheets, etc.

In some embodiments according to the present inventive subject matter, a portion (or portions) of any component of the lighting device) can comprise one or more thermal transfer region(s) that has/have an elevated heat conductivity (e.g., higher than the rest of that component. A thermal transfer region (or regions) can be made of any suitable material, and can be of any suitable shape. Use of materials having higher heat conductivity in making the thermal transfer region(s) generally provides greater heat transfer, and use of thermal transfer region(s) of larger surface area and/or cross-sectional area generally provides greater heat transfer. Representative examples of materials that can be used to make the thermal transfer region(s), if provided, include metals, diamond, DLC, etc. Representative examples of shapes in which the thermal transfer region(s), if provided, can be formed include bars, slivers, slices, crossbars, wires and/or wire patterns. A thermal transfer region (or regions), if included, can also function as one or more pathways for carrying electricity, if desired.

The lighting devices according to the present inventive subject matter can employ any suitable heat dissipation scheme, a wide variety of which (e.g., one or more heat dissipation structures) are well known to persons skilled in the art and/or which can readily be envisioned by persons skilled in the art.

Lighting devices according to the present inventive subject matter can be of any desired overall shape and size. In some embodiments, the lighting devices according to the present inventive subject matter are of size and shape (i.e., form factor) that correspond to any of the wide variety of light sources in existence, e.g., A lamps, B-10 lamps, BR lamps, C-7 lamps, C-15 lamps, ER lamps, F lamps, G lamps, K lamps, MB lamps, MR lamps, PAR lamps, PS lamps, R lamps, S lamps, S-11 lamps, T lamps, Linestra 2-base lamps, AR lamps, ED lamps, E lamps, BT lamps, Linear fluorescent lamps, U-shape fluorescent lamps, circline fluorescent lamps, single twin tube compact fluorescent lamps, double twin tube compact fluorescent lamps, triple twin tube compact fluorescent lamps, A-line compact fluorescent lamps, screw twist compact fluorescent lamps, globe screw base compact fluorescent lamps, reflector screw base compact fluorescent lamps, etc. Within each of the lamp types identified in the previous sentence, numerous different varieties (or an infinite number of varieties) exist. For example, a number of different varieties of conventional A lamps exist and include those identified as A 15 lamps, A 17 lamps, A 19 lamps, A 21 lamps and A 23 lamps. The expression "A lamp" as used herein includes any lamp that satisfies the dimensional characteristics for A lamps as defined in ANSI C78.20-2003, including the conventional A lamps identified in the preceding sentence. The lamps according to the present inventive subject matter can satisfy (or not satisfy) any or all of the other characteristics for A lamps (defined in ANSI C78.20-2003), or for any other type of lamp.

In many situations, the lifetime of solid state light emitters, can be correlated to a thermal equilibrium temperature (e.g., junction temperatures of solid state light emitters). The correlation between lifetime and junction temperature may differ based on the manufacturer (e.g., in the case of solid state light emitters, Cree, Inc., Philips-Lumileds, Nichia, etc). The lifetimes are typically rated as thousands of hours at a particular temperature (junction temperature in the case of solid state light emitters). Thus, in particular embodiments, the component or components of the thermal management system of the lighting device is/are selected so as to extract heat from the solid state light emitter(s) and dissipate the extracted heat to a surrounding environment at such a rate that a temperature is maintained at or below a particular temperature (e.g., to maintain a junction temperature of a solid state light emitter at or below a 25,000 hour rated lifetime junction temperature for the solid state light source in a 25° C. surrounding environment, in some embodiments, at or below a 35,000 hour rated lifetime junction temperature, in further embodiments, at or below a 50,000 hour rated lifetime junction temperature, or other hour values, or in other embodiments, analogous hour ratings where the surrounding temperature is 35° C. (or any other value).

Solid state light, emitter lighting systems can offer a long operational lifetime relative to conventional incandescent and fluorescent bulbs. LED lighting system lifetime is typically measured by an "L70 lifetime", i.e., a number of operational hours in which the light output of the LED lighting system does not degrade by more than 30%. Typically, an L70 lifetime of at least 25,000 hours is desirable, and has become a standard design goal. As used herein, L70 lifetime is defined by Illuminating Engineering Society Standard LM-80-08, entitled "*IES Approved Method for Measuring Lumen Maintenance of LED Light Sources*", Sep. 22, 2008, ISBN No. 978-0-87995-227-3, also referred to herein as "LM-80", the disclosure of which is hereby incorporated herein by reference in its entirety as if set forth fully herein.

Various embodiments are described herein with reference to "expected L70 lifetime." Because the lifetimes of solid state lighting products are measured in the tens of thousands of hours, it is generally impractical to perform full term testing to measure the lifetime of the product. Therefore, projections of lifetime from test data on the system and/or light source are used to project the lifetime of the system. Such testing methods include, but are not limited to, the lifetime projections found in the ENERGY STAR Program Requirements cited above or described by the ASSIST method of lifetime prediction, as described in "*ASSIST Recommends . . . LED Life For General Lighting: Definition of Life*", Volume 1, Issue 1, February 2005, the disclosure of which is hereby incorporated herein by reference as if set forth fully herein. Accordingly, the term "expected L70 lifetime" refers to the predicted L70 lifetime of a product as evidenced, for example, by the L70 lifetime projections of ENERGY STAR, ASSIST and/or a manufacturer's claims of lifetime.

Lighting devices according to some embodiments of the present inventive subject matter provide an expected L70 lifetime of at least 25,000 hours. Lighting devices according to some embodiments of the present inventive subject matter provide expected L70 lifetimes of at least 35,000 hours, and lighting devices according to some embodiments of the present inventive subject matter provide expected L70 lifetimes of at least 50,000 hours.

In some aspects of the present inventive subject matter, there are provided lighting devices that provide good efficiency and that are within the size and shape constraints of the lamp for which the lighting device is a replacement. In some embodiments of this type, there are provided lighting devices that provide lumen output of at least 600 lumens, and in some embodiments at least 750 lumens, at least 900 lumens, at least 1000 lumens, at least 1100 lumens, at least 1200 lumens, at least 1300 lumens, at least 1400 lumens, at least 1500 lumens, at least 1600 lumens, at least 1700 lumens, at least 1800 lumens (or in some cases at least even higher lumen outputs), and/or CRI Ra of at least 70, and in some embodiments at least 80, at least 85, at least 90 or at least 95).

In some aspects of the present inventive subject matter, which can include or not include any of the features described elsewhere herein, there are provided lighting devices that provide sufficient lumen output (to be useful as a replacement for a conventional lamp), that provide good efficiency and that are within the size and shape constraints of the lamp for which the lighting device is a replacement. In some cases, "sufficient lumen output" means at least 75% of the lumen output of the lamp for which the lighting device is a replacement, and in some cases, at least 85%, 90%, 95%, 100%, 105%, 110%, 115%, 120% or 125% of the lumen output of the lamp for which the lighting device is a replacement.

The lighting devices according to the present inventive subject matter can direct light in any desired range of directions. For instance, in some embodiments, the lighting device can direct light substantially omnidirectionally (i.e., substantially 100% of all directions extending from a center of the lighting device), i.e., within a volume defined by a two-dimensional shape in an x, y plane that encompasses rays extending from 0 degrees to 180 degrees relative to the y axis (i.e., 0 degrees extending from the origin along the positive y axis, 180 degrees extending from the origin along the negative y axis), the two-dimensional shape being rotated 360 degrees about the y axis (in some cases, the y axis can be a vertical axis of the lighting device). In some embodiments, the lighting device emits light substantially in all directions within a volume defined by a two-dimensional shape in an x, y plane that encompasses rays extending from 0 degrees to 150 degrees relative to the y axis (extending along a vertical axis of the lighting device), the two-dimensional shape being rotated 360 degrees about the y axis. In some embodiments, the lighting device emits light substantially in all directions within a volume defined by a two-dimensional shape in an x, y plane that encompasses rays extending from 0 degrees to 120 degrees relative to the y axis (extending along a vertical axis of the lighting device), the two-dimensional shape being rotated 360 degrees about the y axis. In some embodiments, the lighting device emits light substantially in all directions within a volume defined by a two-dimensional shape in an x, y plane that encompasses rays extending from 0 degrees to 90 degrees relative to the y axis (extending along a vertical axis of the lighting device), the two-dimensional shape being rotated 360 degrees about the y axis (i.e., a hemispherical region). In some embodiments, the two-dimensional shape can instead encompass rays extending from an angle in the range of from 0 to 30 degrees (or from 30 degrees to 60 degrees, or from 60 degrees to 90 degrees) to an angle in the range of from 90 to 120 degrees (or from 120 degrees to 150 degrees, or from 150 degrees to 180 degrees). In some embodiments, the range of directions in which the lighting device emits light can be non-symmetrical about any axis, i.e., different embodiments can have any suitable range of directions of light emission, which can be continuous or discontinuous (e.g., regions of ranges of emissions can be surrounded by regions of ranges in which light is not emitted). In some embodiments, the lighting device can emit light in at least 50% of all directions extending from a center of the lighting device (e.g., hemispherical being 50%), and in some embodiments at least 60%, 70%, 80%, 90% or more.

Lighting devices according to the present inventive subject matter can be configured to emit (when supplied with electricity) light of any color or hue. For example, in some embodiments, lighting devices can emit white light (i.e., they can include light emitters and/or luminescent material which emit light that, when blended, mix to produce light that is perceived as white light). Alternatively, in some embodiments, lighting devices can emit light that is blue, green, yellow, orange, red, or any other color or hue.

As noted above, the present inventive subject matter also provides a method that comprises removing at least a first removable encapsulant element from a lighting device that comprises at least a first solid state light emitter, and inserting at least a second removable encapsulant element into the lighting device. The removal of the first removable encapsulant element and the insertion of the second removable encapsulant element can be carried out at any suitable time, e.g., periodically and/or when a particular characteristic of the lighting device (e.g., color accuracy or brightness) falls below one or more particular characteristic, e.g., after at least 200 hours of operation, after at least 500 hours of operation, after at least 1,000 hours of operation, after at least 2,000 hours of operation, after at least 5,000 hours of operation, after at least 10,000 hours of operation, after at least 25,000 hours of operation, after at least 50,000 hours of operation, after at least 100,000 hours of operation, etc.

Embodiments in accordance with the present inventive subject matter are described herein in detail in order to provide exact features of representative embodiments that are within the overall scope of the present inventive subject matter. The present inventive subject matter should not be understood to be limited to such detail.

Embodiments in accordance with the present inventive subject matter are also described with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as being limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present inventive subject matter.

The lighting devices illustrated herein are illustrated with reference to cross-sectional drawings. These cross sections may be rotated around a central axis to provide lighting devices that are circular in nature. Alternatively, the cross sections may be replicated to form sides of a polygon, such as a square, rectangle, pentagon, hexagon or the like, to provide a lighting device. Thus, in some embodiments, objects in a center of the cross-section may be surrounded, either completely or partially, by objects at the edges of the cross-section.

Figure 2:
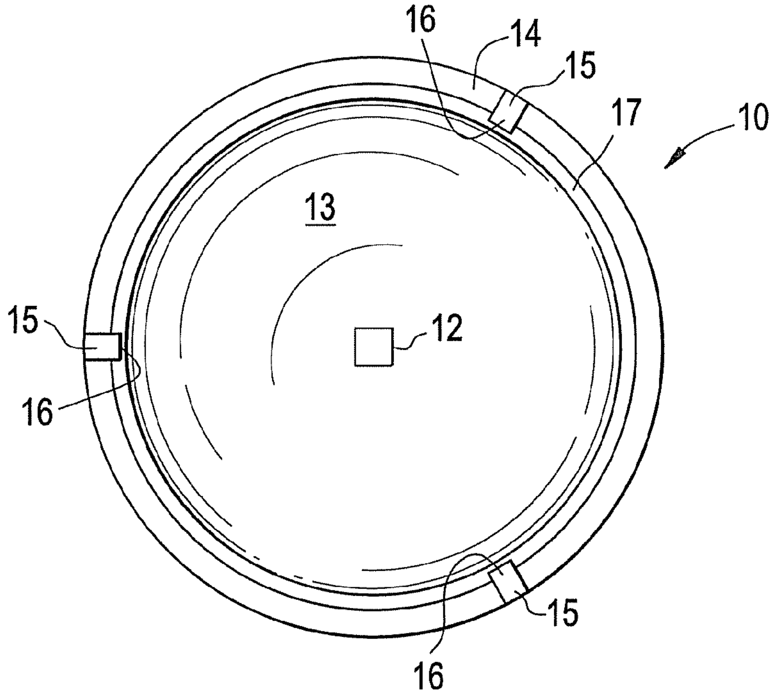
FIG. 2 is a top view of the lighting device element 10.

FIG. 1 is a cross-sectional view of a lighting device element 10 that comprises an encapsulant holding element 11 and a solid state light emitter 12 (which can be, e.g., a light emitting diode), and FIG. 2 is a top view of the lighting device element 10.

The encapsulant holding element 11 comprises a first holding element structure 13 and a second holding element structure 14. The first holding element structure 13 is releasably held in place relative to the second holding element structure 14 by three flexible clips 15. Only one of the three clips 15 is visible in FIG. 1, because the clips 15 are spaced substantially evenly around the circular periphery of the second holding element structure (i.e., each is about 120 degrees from its neighbors). Alternatively, any other number of clips can be included, and can be spaced in any suitable way.

Each of the clips 15 includes a protrusion 16. As seen in FIG. 1, the first holding element structure 13 has a circumferential flange 17 that extends under the protrusions 16, whereby the protrusions 16 prevent the circumferential flange 17 from moving away from the second holding element structure 14, which prevents the first holding element structure 13 from moving away from the second holding element structure 14.

In order to open the encapsulant holding element 11, e.g., to insert an encapsulant element (e.g., a removable encapsulant element) into the second holding element structure or to remove an encapsulant element (e.g., a removable encapsulant element) from the second holding element structure, one or more of the clips 15 can be bent so that the respective protrusion 16 (or protrusions 16) is/are moved out of the way of the circumferential flange 17, so that the circumferential flange 17 can be moved away from the second holding element structure 14, and therefore the first holding element structure 13 can be moved away from the second holding element structure 14.

In order to close the encapsulant holding element 11, e.g., after an encapsulant element (e.g., a removable encapsulant element) has been positioned on the second holding element structure, one or more of the clips 15 can be bent so that the respective protrusion 16 (or protrusions 16) is/are moved out of the way of the circumferential flange 17, so that the circumferential flange 17 can be moved toward from the second holding element structure 14, and therefore the first holding element structure 13 can be moved into engagement with the second holding element structure 14. In some embodiments, surfaces of the protrusion 16 and surfaces of the circumferential flange 17 can be shaped and aligned such that pushing the first holding element structure 13 toward the second holding element structure 14 causes surfaces of the protrusions 16 to come into contact with the surfaces of the circumferential flange 17, and further pushing of the first holding element structure 13 toward the second holding element structure 14 causes those surfaces of the circumferential flanges 17 to push the protrusions 16 outward, allowing the first holding element structure 13 to be pushed toward the second holding element structure 14, after which the protrusions 16 bend back to their rest positions, at which they prevent the circumferential flange 17 from moving away from the second holding element structure 14, which prevents the first holding element structure 13 from moving away from the second holding element structure 14. In some embodiments, the clips 15 can be rotatably mounted on the second holding element structure 14, whereby they can be rotated out of the way of the circumferential flange 17 (for opening the encapsulant holding element 11), and then rotated into the way of the circumferential flange 17, i.e., to a location where they block movement of the circumferential flange 17 (for closing the encapsulant holding element 11).

As shown in FIG. 1, the solid state light emitter 12 is mounted on the second holding element structure 14, which can comprise a circuit board with electrically conductive regions formed thereon.

The first holding element structure 13 in this embodiment is substantially transparent (e.g., the first holding element structure 13 can comprise a rigid glass lens). In some embodiments, one or more luminescent materials can be on the first holding element structure 13 and/or dispersed within the first holding element structure 13.

FIG. 11 is a cross-sectional view of an encapsulant element 110 that can be received in the encapsulant holding element 11 depicted in FIG. 1. The encapsulant element 110 comprises particles of a luminescent material 111 dispersed within a matrix material 112, e.g., silicone. Alternatively, the encapsulant element 110 can include no luminescent material. The encapsulant element 110 defines a cavity 113 which is smaller than the solid state light emitter 12. The encapsulant element 110 can be deformable and can be compressed such that there is no gap between the solid state light emitter 12 (e.g., an LED chip) and the encapsulant element 110. In some embodiments, a grease or a deformable film or liquid can be located between the solid state light emitter 12 and the encapsulant element 110 to improve optical coupling between the solid state light emitter 12 and the encapsulant element 110. In some cases, the encapsulant element 110 can be oversized (i.e., larger than the space defined between the first holding element structure 13 and the second holding element structure and can be compressed to conform around the shape of the solid state light emitter 12 and the inside of the first holding element structure 13 (which can be a lens).

As mentioned above, the first holding element structure 13 is held in place relative to the second holding element structure 14 by the clips 15 and the circumferential flange 17. Alternatively or additionally, the first holding element structure 13 can be held in place relative to the second holding element structure 14 by any other suitable structure. For example:

FIG. 3 is a partial cross-sectional view depicting a portion of a first holding element structure 13 that is held in place relative to a second holding element structure 14 by providing threads 31 on an edge surface of the second holding element structure 14 which are threadedly engaged in corresponding threads 32 provided in the interior of the first holding element structure 13.

FIG. 4 is a partial cross-sectional view depicting a portion of a first holding element structure 13 that is held in place relative to a second holding element structure 14 by providing pins 41 (which can be rigid or which can be retractable and spring biased outward) on the second holding element structure 14 which fit into recesses 42 in the first holding element structure 13.

FIG. 5 is a partial cross-sectional view depicting a portion of a first holding element structure 13 that is held in place relative to a second holding element structure 14 using screws 52 (only one is visible in FIG. 5) that extend through the first holding element structure 13 and through a portion of the second holding element structure 14.

FIG. 6 is a partial cross-sectional view depicting a portion of a first holding element structure 13 that is held in place relative to a second holding element structure 14 using adhesive 61.

FIG. 7 is a partial cross-sectional view depicting a portion of a first holding element structure 13 that is held in place relative to a second holding element structure 14 through geometry, wherein an external frustoconical surface 71 on the first holding element structure 13 engages an internal frustoconical surface 72 on the second holding element structure 14 (optionally with pressing).

FIG. 8 is a partial cross-sectional view depicting a portion of a first holding element structure 13 that is held in place relative to a second holding element structure 14 by sliding engagement, in which the first holding element structure 13, which includes a flange region 81, slides into a space defined by a lip 82 which is on the second holding element structure 14 (and the flange region 81 can be pressed on opposite sides by the lip 82.

FIG. 9 is a partial cross-sectional view depicting a portion of a first holding element structure 13 that is held in place relative to a second holding element structure 14 by a magnet 91 that is attached to the first holding element structure 13 and that attracts a metal element 92 that is attached to the second holding element structure 14.

FIG. 10 is a partial cross-sectional view depicting a portion of a first holding element structure 13 that is held in place relative to a second holding element structure 14 by a spring 101, one end of which is attached to the first holding element structure 13, the other end of which is attached to the second holding element structure 14.

FIG. 12 is a cross-sectional view of a lighting device that comprises a lighting device element 10 as depicted in FIG. 1 and an encapsulant element 110 as depicted in FIG. 11, the encapsulant element 110 located between the first holding element structure 13 and the second holding element structure 14 (the encapsulant holding element 11 substantially surrounds the encapsulant element 110, and retains the encapsulant element 110 where at least some light emitted by the solid state light emitter 12 enters the encapsulant element 110). The encapsulant holding element 11 defines a space, and the solid state light emitter 12 and the encapsulant element 110 substantially fill the space.

FIG. 13 is a cross-sectional view of a lighting device 130 that comprises an electrical connector 131, a power conversion circuit board 132 (on which power supply circuitry and/or driver circuitry is/are provided), a pair of wires 133 that electrically connect the power conversion circuit board 132 to the electrical connector 131, a solid state light emitter circuit board 134 on which a solid state light emitter 135 is mounted, a heat sink 136, a removable encapsulant element 137, a lens 138 with optics formed therein and/or thereon, a conformable silicone gap filler 139, a housing member 140 and a pair of conductive pins 141. The removable encapsulant element 137 has luminescent material dispersed therein. The heat sink 136 is smaller than would otherwise be used, in view of the fact that the removable encapsulant element 137 can be replaced if and when the encapsulant in the removable encapsulant element 137 becomes degraded. In this embodiment, an end region of the lens 138 is compressible, whereby protrusions 142 can be moved out of engagement with corresponding recesses 143 in the housing member 140, so that the lens 138 can be removed from the housing member 140 in order to replace the removable encapsulant element 137 if desired or necessary (alternatively, any other suitable way to remove and/or replace the removable encapsulant element 137 can be provided).

FIG. 14 is a cross-sectional view of a lighting device 145 in the form of a back-reflector device. The lighting device 145 comprises a holding element (that includes a first holding element structure 146 and a second holding element structure 147), a removable encapsulant element 148 and a solid state light emitter 144. In this embodiment, the first holding element structure 146 is a substantially transparent lens, in which particles of luminescent material are dispersed, and on which the solid state light emitter 144 is mounted (alternatively, the first holding element structure 146 can be in the form of a bridge). The second holding element structure 147 is a reflector.

FIG. 15 is a cross-sectional view of a lighting device 150 that comprises a removable encapsulant element 151 and a solid state light emitter 152 (which can be, e.g., a light emitting diode). The removable encapsulant element 151 comprises particles of a luminescent material 153 dispersed within a matrix material 154, e.g., silicone. The solid state light emitter 152 is on a support 155. A space 156 between the removable encapsulant element 151, the support 155 and the solid state light emitter 152 can be filled with air (or, if desired, it can be filled with any other suitable material or a vacuum).

The removable encapsulant element 151 is releasably held in place relative to the support 155 by three flexible clips 157. Only one of the three clips 157 is visible in FIG. 15, because the clips 157 are spaced substantially evenly around the circular periphery of the support 155 (i.e., each is about 120 degrees from its neighbors). Alternatively, any other number of clips can be included, and can be spaced in any suitable way.

While certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

Any two or more structural parts of the lighting devices, lighting device elements and lighting device components described herein can be integrated. Any structural part of the lighting devices, lighting device elements and lighting device components described herein can be provided in two or more parts (which may be held together in any known way, e.g., with adhesive, screws, bolts, rivets, staples, etc.).

The invention claimed is:

1. A lighting device, comprising: at least a first solid state light emitter; and at least a first removable encapsulant element, the first removable encapsulant element non-liquid, the first removable encapsulant element is the first element that light emitted from the first solid state light emitter enters after said light is emitted from the first solid state light emitter, an interface between the first solid state light emitter and the first removable encapsulant element is substantially or completely without a gap.

2. A lighting device as recited in claim 1, wherein the first solid state light emitter comprises a light emitting diode.

3. A lighting device as recited in claim 1, wherein the first removable encapsulant element comprises at least one luminescent material.

4. A lighting device as recited in claim 1, wherein the first removable encapsulant element is configured to be removed from the lighting device as an element.

5. A lighting device as recited in claim 1, wherein the first removable encapsulant element comprises at least one material selected from among silicone materials, epoxy materials, glass materials and metal oxide materials.

6. A lighting device as recited in claim 5, wherein the first removable encapsulant element further comprises at least one luminescent material.

7. A lighting device as recited in claim 1, wherein the lighting device further comprises at least one encapsulant holding element, the at least one encapsulant holding element retaining the first removable encapsulant element where at least some light emitted by the first solid state light emitter enters the first removable encapsulant element.

8. A lighting device as recited in claim 7, wherein the at least one encapsulant holding element comprises a first holding element structure and a second holding element structure, and the first removable encapsulant element is between the first holding element structure and the second holding element structure.

9. A lighting device as recited in claim 8, wherein at least a portion of the first holding element structure is substantially transparent.

10. A lighting device as recited in claim 8, wherein the first holding element structure is releasably held in place relative to the second holding element structure.

11. A lighting device as recited in claim 8, wherein the first solid state light emitter is mounted on the second holding element structure.

12. A lighting device as recited in claim 11, wherein the second holding element structure comprises at least one electrically conductive region.

13. A lighting device as recited in claim 7, wherein the at least one encapsulant holding element substantially surrounds the first removable encapsulant element.

14. A lighting device as recited in claim 7, wherein the encapsulant holding element defines a space, and the at least a first solid state light emitter and the at least a first removable encapsulant element substantially fill the space.

15. A lighting device element, comprising: at least a first solid state light emitter; and at least one encapsulant holding element configured to releasably hold at least a first removable non-liquid encapsulant element where at least some light emitted by the first solid state light emitter would enter the first removable encapsulant element, and the first removable encapsulant element would be the first element that said light enters after said light is emitted from the first solid state light emitter, and an interface between the first solid state light emitter and the first removable encapsulant element would be substantially or completely without a gap.

16. A lighting device element as recited in claim 15, wherein the first removable encapsulant element is configured to be removed from the lighting device element as an element.

17. A lighting device element as recited in claim 15, wherein the first removable encapsulant element comprises at least one material selected from among silicone materials, epoxy materials, glass materials and metal oxide materials.

18. A lighting device element as recited in claim 17, wherein the first removable encapsulant clement further comprises at least one luminescent material.

19. A lighting device element as recited in claim 15, wherein the at least one encapsulant holding element comprises a first holding element structure and a second holding element structure.

20. A lighting device element as recited in claim 19, wherein at least a portion of the first holding element structure is substantially transparent.

21. A lighting device clement as recited in claim 19, wherein the first holding element structure is releasably held in place relative to the second holding element structure.

22. A lighting device clement as recited in claim 19, wherein the first solid state light emitter is mounted on the second holding clement structure.

23. A lighting device element as recited in claim 22, wherein the second holding element structure comprises at least one electrically conductive region.

24. A lighting device component, comprising a removable encapsulant element, the removable encapsulant element configured to be the first element that light emitted from a first solid state light emitter enters after said light is emitted from the first solid state light emitter, the removable encapsulant element configured to be positioned such that an interface between the first solid state light emitter and the removable encapsulant element is substantially or completely without a gap the removable encapsulant element non-liquid.

25. A lighting device component as recited in claim 24, wherein the first removable encapsulant element is configured to be positioned in a lighting device as an element and removed from the lighting device as an element.

26. A lighting device component as recited in claim 24, wherein the removable encapsulant element comprises at least one luminescent material.

27. A lighting device component as recited in claim 26, wherein the first removable encapsulant element further comprises at least one material selected from among silicone materials, epoxy materials, glass materials and metal oxide materials.

28. A method, comprising: opening a first encapsulant holding element that retains a first removable encapsulant element, the first removable encapsulant element non-liquid, the first removable encapsulant element comprising at least one luminescent material, the first encapsulant holding element in a lighting device that also comprises at least a first solid state light emitter, an interface between the first solid state light emitter and the first removable encapsulant element is substantially or completely without a gap, removing the first removable encapsulant element from the lighting device; inserting at least a second removable encapsulant element into the lighting device, and closing the first encapsulant holding element.

29. A method as recited in claim 28, wherein the first solid state light emitter comprises a light emitting diode.

30. A method as recited in claim 28, wherein the first removable encapsulant element comprises at least one material selected from the group consisting of epoxy and silicone.

31. A method as recited in claim 28, wherein there is substantially no space between the first removable encapsulant element and the first solid state light emitter.

32. A method as recited in claim 28, wherein the first encapsulant holding element comprises a first holding element structure and a second holding element structure, the first encapsulant holding element has a closed position, in which the first removable encapsulant element is between the first holding element structure and the second holding element structure, the first encapsulant holding element has an open position, said opening the first encapsulant holding element comprises moving the first holding element structure relative to the second holding element structure to change the first encapsulant holding element from the closed position to the open position, and said closing the first encapsulant holding element comprises moving the first holding element structure relative to the second holding element structure to change the first encapsulant holding element from the open position to the closed position.

33. A method as recited in claim 32, wherein at least a portion of the first holding element structure is substantially transparent.

34. A method as recited in claim 32, wherein the first solid state light emitter is mounted on the second holding element structure.

35. An encapsulant element comprising: a substantially transparent first material; and at least one luminescent material within the substantially transparent first material, the encapsulant element configured to be removably positioned relative to at least a first solid state light emitter such that an interface between the first solid state light emitter and the encapsulant element is substantially or completely without a gap, the encapsulant element non-liquid.

36. An encapsulant element as recited in claim 35, wherein the substantially transparent first material is deformable.

37. An encapsulant element as recited in claim 35, wherein the at least one luminescent material is dispersed within the substantially transparent first material.

38. An encapsulant element as recited in claim 35, wherein the encapsulant element is configured to be positioned in a lighting device as an element and removed from the lighting device as an element.

39. A method, comprising:

removing at least a first removable encapsulant element from a lighting device that comprises at least a first solid state light emitter; and inserting at least a second removable encapsulant element into the lighting device, the second removable encapsulant element configured to be the first element that light emitted from a first solid state light emitter enters after said light is emitted from the first solid state light emitter, and with an interface between the first solid state light emitter and the first removable encapsulant element substantially or completely without a gap.

40. A method as recited in claim 39, wherein the first removable encapsulant element is removed from the lighting device as an element.

41. A method as recited in claim 39, wherein the first removable encapsulant element comprises at least one material selected from among silicone materials, epoxy materials, glass materials and metal oxide materials.

42. A method as recited in claim 41, wherein the first removable encapsulant element further comprises at least one luminescent material.

43. A lighting device, comprising: at least a first solid state light emitter; at least a first removable encapsulant element, the first removable encapsulant element non-liquid; a first holding element; and a second holding element, the first removable encapsulant element removably held between and encapsulated by the first holding element and the second holding element, and an interface between the first solid state light emitter and the first removable encapsulant element is substantially or completely without a gap.

44. A lighting device as recited in claim 43, wherein the first removable encapsulant element is in a region defined by the first holding element structure and the second holding element structure.

45. A lighting device as recited in claim 43, wherein:

the first holding element comprises at least a first flange, the second holding element comprises at least a first clip, at least a portion of the first flange is between the first clip and a portion of the second holding element.

46. A lighting device as recited in claim 43, wherein the first holding element is releasably held relative to the second holding element by at least one screw extending through at least a portion of the first holding element and at least a portion of the second holding element.

47. A lighting device as recited in claim 43, wherein the first holding element is releasably held relative to the second holding element by at least one adhesive.

48. A lighting device as recited in claim 43, wherein the first holding element is releasably held relative to the second holding element by geometry, wherein an external frustoconical surface on the first holding element engages an internal frustoconical surface on the second holding element.

49. A lighting device as recited in claim 43, wherein the first holding element is releasably held relative to the second holding element by a magnet.

50. A lighting device as recited in claim 49, wherein the magnet is attached to one of the first holding element and the second holding element, a metal element is attached to the other of the first holding element and the second holding element, and the magnet attracts the metal element.

51. A lighting device as recited in claim 43, wherein the first holding element is releasably held relative to the second holding element by at least one flexible clip.

52. A lighting device as recited in claim 51, wherein the second holding element comprises the clip, and the first holding element comprises a flange that engages the clip.

53. A lighting device as recited in claim 52, wherein the clip comprises a protrusion, and the flange extends under the protrusion to engage the clip.

54. A lighting device as recited in claim 43, wherein the first holding element is releasably held relative to the second holding element by an engagement of threads.

55. A lighting device as recited in claim 43, wherein the first holding element is releasably held relative to the second holding element by at least one pin.

56. A lighting device as recited in claim 55, wherein the second holding element comprises the pin, the first holding element comprises at least one recess, and the pin fits into the recess.

57. A lighting device as recited in claim 43, wherein:

the first holding element structure comprises at least a first protrusion, the second holding element structure comprises at least a first recess, the first protrusion is in the first recess.

58. A lighting device as recited in claim 57, wherein the first holding element structure is a lens.

59. A lighting device as recited in claim 57, wherein the second holding element structure is a lens.

60. A lighting device as recited in claim 43, wherein the first holding element is releasably held relative to the second holding element by a biasing element.

61. A lighting device as recited in claim 60, wherein the biasing element comprises at least one spring.

62. A lighting device as recited in claim 60, wherein one end of the spring is attached to the first holding element structure, and the other end of the spring is attached to the second holding element structure.

63. A lighting device, comprising:

at least a first solid state light emitter;

at least a first removable encapsulant element; and at least a first support, the first removable encapsulant element where at least some light emitted by the first solid state light emitter enters the first removable encapsulant element, the first solid state light emitter on the first support, at least one of the first removable encapsulant element and the first support comprising at least a first flange, that is between respective portions of the other of the first removable encapsulant element and the first support.

64. A lighting device as recited in claim 63, wherein:

the first removable encapsulant element comprises at least a first flange, the first support comprises at least a first clip, at least a portion of the first flange is between the first clip and a portion of the first support.

65. A lighting device as recited in claim 63, wherein:

the first support comprises at least a first flange, the first removable encapsulant element comprises at least a first clip, at least a portion of the first flange is between the first clip and a portion of the first removable encapsulant element.

* * * * *

UNITED STATES PATENT AND TRADEMARK OFFICE

CERTIFICATE OF CORRECTION

PATENT NO. : 8,896,005 B2
APPLICATION NO. : 12/846036
DATED : November 25, 2014
INVENTOR(S) : Antony Paul Van De Ven and Gerald H. Negley It is certified that error appears in the above-identified patent and that said Letters Patent is hereby corrected as shown below:

In the Specification

Column 8, Line 66

Please change: "comprises a a lighting device element 10 as depicted in Fig." to -- comprises a lighting device element 10 as depicted in Fig. --

In the Claims

Column 38, Line 13, Claim 18

Please change: "wherein the first removable encapsulant clement further" to -- wherein the first removable encapsulant element further --

Column 38, Line 27, Claim 22

Please change: "second holding clement structure." to -- second holding element structure. --

Column 38, Line 38, Claim 24

Please change: "gap the removable encapsulant element non-liquid." to -- gap, the removable encapsulant element non-liquid. --

Signed and Sealed this
Twenty-eighth Day of April, 2015

Michelle K. Lee

Michelle K. Lee
*Director of the United States Patent and Trademark Office*